(12) United States Patent
Brashears et al.

(10) Patent No.: US 7,971,173 B1
(45) Date of Patent: Jun. 28, 2011

(54) METHOD AND SYSTEM FOR IMPLEMENTING PARTIAL RECONFIGURATION AND RIP-UP OF ROUTING

(75) Inventors: Richard Brashears, San Jose, CA (US); Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 450 days.

(21) Appl. No.: 11/741,685

(22) Filed: Apr. 27, 2007

Related U.S. Application Data

(60) Provisional application No. 60/795,794, filed on Apr. 28, 2006.

(51) Int. Cl.
   *G06F 17/50* (2006.01)
(52) U.S. Cl. ........ 716/126; 716/110; 716/111; 716/129; 716/130; 716/131; 716/136; 716/139; 703/14
(58) Field of Classification Search ................... 716/1, 2, 716/12, 13, 14; 703/14
   See application file for complete search history.

(56) References Cited

U.S. PATENT DOCUMENTS

| | | | |
|---|---|---|---|
| 5,074,037 A | 12/1991 | Sutcliffe et al. | |
| 5,500,800 A | 3/1996 | Talbott | |
| 5,539,652 A | 7/1996 | Tegethoff | |
| 5,604,680 A * | 2/1997 | Bamji et al. | 716/8 |
| 6,122,443 A | 9/2000 | Nishikawa | |
| 6,223,329 B1 * | 4/2001 | Ling et al. | 716/7 |
| 6,349,403 B1 | 2/2002 | Dutta et al. | |
| 6,507,941 B1 * | 1/2003 | Leung et al. | 716/14 |
| 6,536,014 B1 | 3/2003 | McClannahan et al. | |
| 6,574,779 B2 * | 6/2003 | Allen et al. | 716/1 |
| 6,654,942 B2 * | 11/2003 | Chopra et al. | 716/12 |
| 6,662,348 B1 | 12/2003 | Naylor et al. | |
| 6,691,296 B1 | 2/2004 | Nakayama et al. | |
| 6,898,770 B2 | 5/2005 | Boluki et al. | |
| 6,993,731 B2 | 1/2006 | Whitaker et al. | |
| 7,024,651 B1 * | 4/2006 | Camilleri et al. | 716/12 |

(Continued)

FOREIGN PATENT DOCUMENTS

EP 0693837 A1 1/1996

OTHER PUBLICATIONS

Notice of Allowance dated Jun. 26, 2009 for U.S. Appl. No. 11/741,668.

(Continued)

*Primary Examiner* — Helen Rossoshek
(74) *Attorney, Agent, or Firm* — Vista IP Law Group, LLP

(57) ABSTRACT

Disclosed is an improved method, system, and article of manufacture for implementing routing for an electrical circuit and chip design. A routing architecture can be represented as a spectrum of different granular routing levels. Instead of routing based upon area, routing can be performed for specific routes or portions of routes. Different types of representation or levels of abstraction for the routing can be used for the same net or route. Partial topological reconfiguration, refinement, or rip-up can be performed for a portion of the integrated circuit design, where the portion is smaller than an entire route or net. Non-uniform levels of routing activities or resources may be applied to route the design. Prioritization may be used to route certain portions of the design with greater levels of detail, abstraction, or resources than other portions of the design.

29 Claims, 22 Drawing Sheets

U.S. PATENT DOCUMENTS

| | | | |
|---|---|---|---|
| 7,143,367 B2 * | 11/2006 | Eng ................................ | 716/2 |
| 7,184,919 B2 * | 2/2007 | Carbonell et al. ............ | 702/122 |
| 7,185,305 B1 * | 2/2007 | Rodman ........................ | 716/13 |
| 7,216,326 B2 | 5/2007 | Papanikolaou et al. | |
| 7,240,303 B1 | 7/2007 | Schubert et al. | |
| 7,360,177 B1 * | 4/2008 | Kong et al. .................... | 716/1 |
| 7,398,498 B2 * | 7/2008 | Teig et al. ..................... | 716/12 |
| 7,418,683 B1 | 8/2008 | Sonnard et al. | |
| 7,418,686 B1 | 8/2008 | Knol et al. | |
| 7,437,692 B2 | 10/2008 | Oberlaender | |
| 7,464,358 B1 * | 12/2008 | Wadland et al. ............... | 716/12 |
| 7,523,423 B1 | 4/2009 | Koelbl et al. | |
| 7,757,197 B1 * | 7/2010 | Betz et al. ..................... | 716/16 |
| 2003/0061572 A1 | 3/2003 | McClannahan et al. | |
| 2003/0204822 A1 | 10/2003 | Whitaker et al. | |
| 2004/0139408 A1 | 7/2004 | Boluki et al. | |
| 2005/0060679 A1 | 3/2005 | Papanikolaou et al. | |
| 2005/0108667 A1 | 5/2005 | Iadanza et al. | |
| 2006/0252184 A1 | 11/2006 | Tabira et al. | |
| 2006/0288323 A1 * | 12/2006 | Birch .............................. | 716/12 |
| 2007/0147269 A1 * | 6/2007 | Ettle et al. ..................... | 370/254 |
| 2007/0162268 A1 * | 7/2007 | Kota et al. ..................... | 703/14 |
| 2009/0031275 A1 * | 1/2009 | Cho et al. ...................... | 716/13 |

OTHER PUBLICATIONS

Notice of Allowance dated Aug. 11, 2009 for U.S. Appl. No. 11/741,694.

* cited by examiner

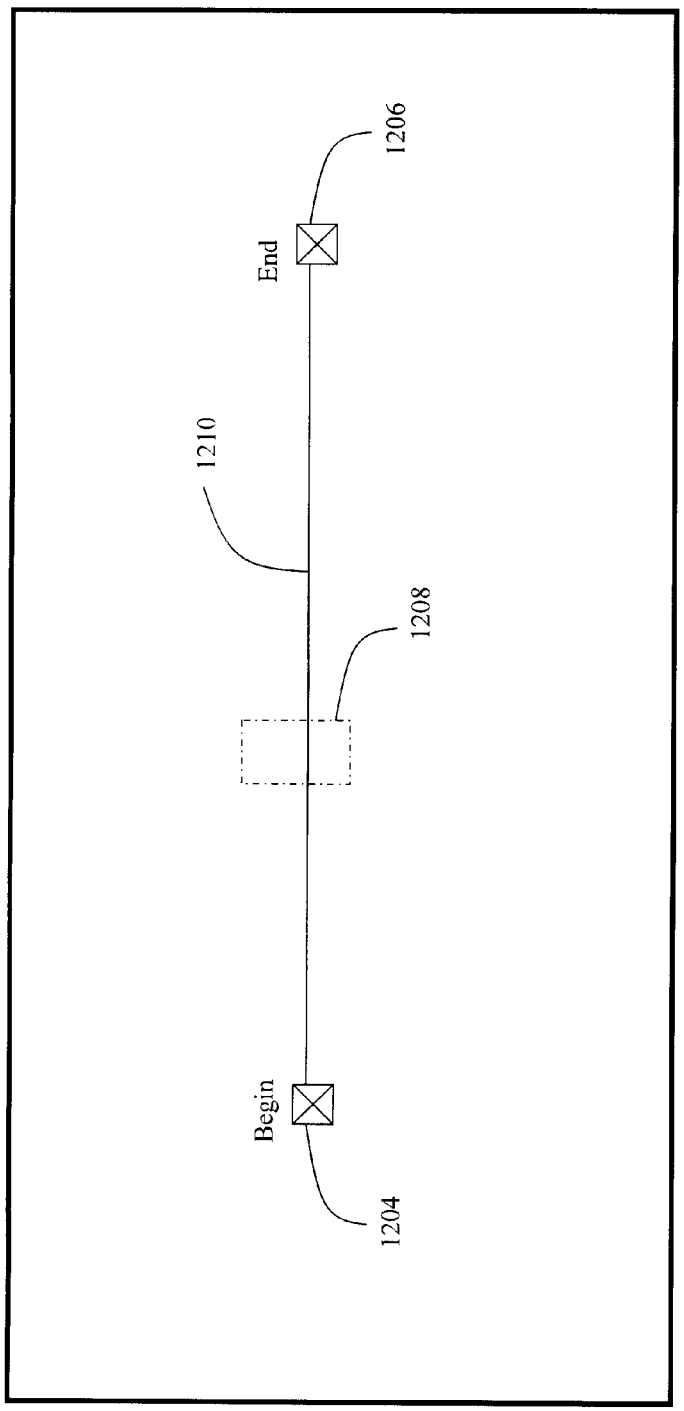
Fig. 12
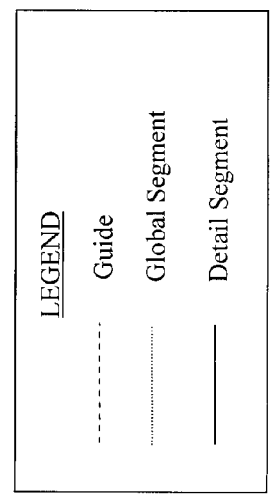

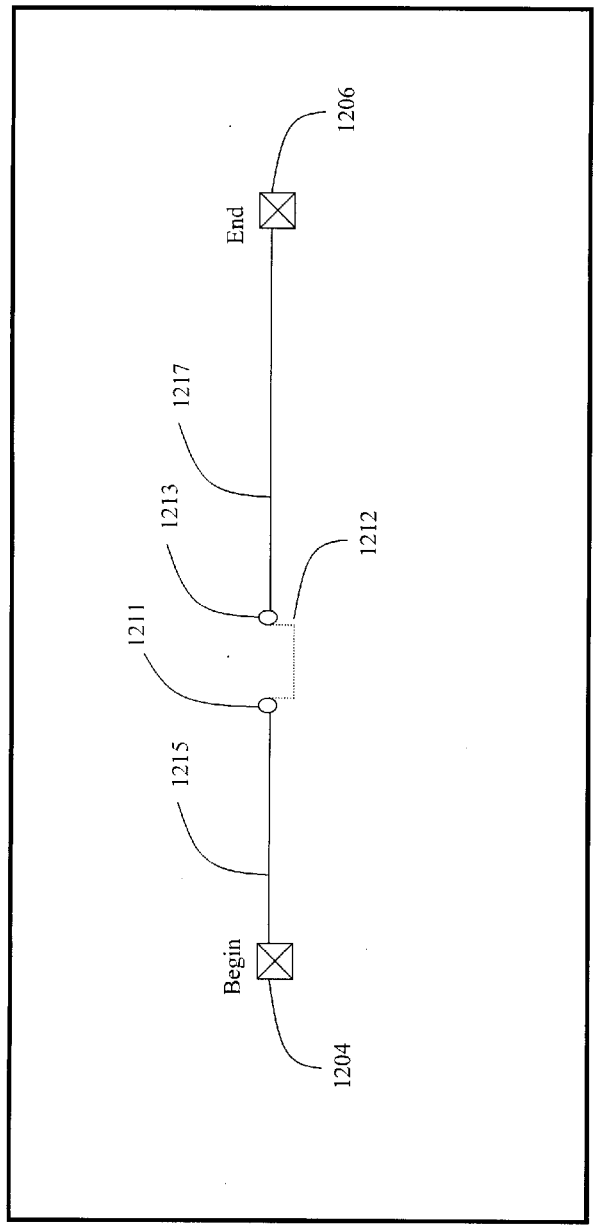
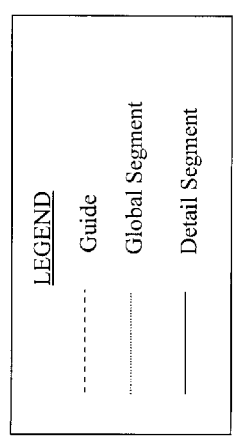
Fig. 13

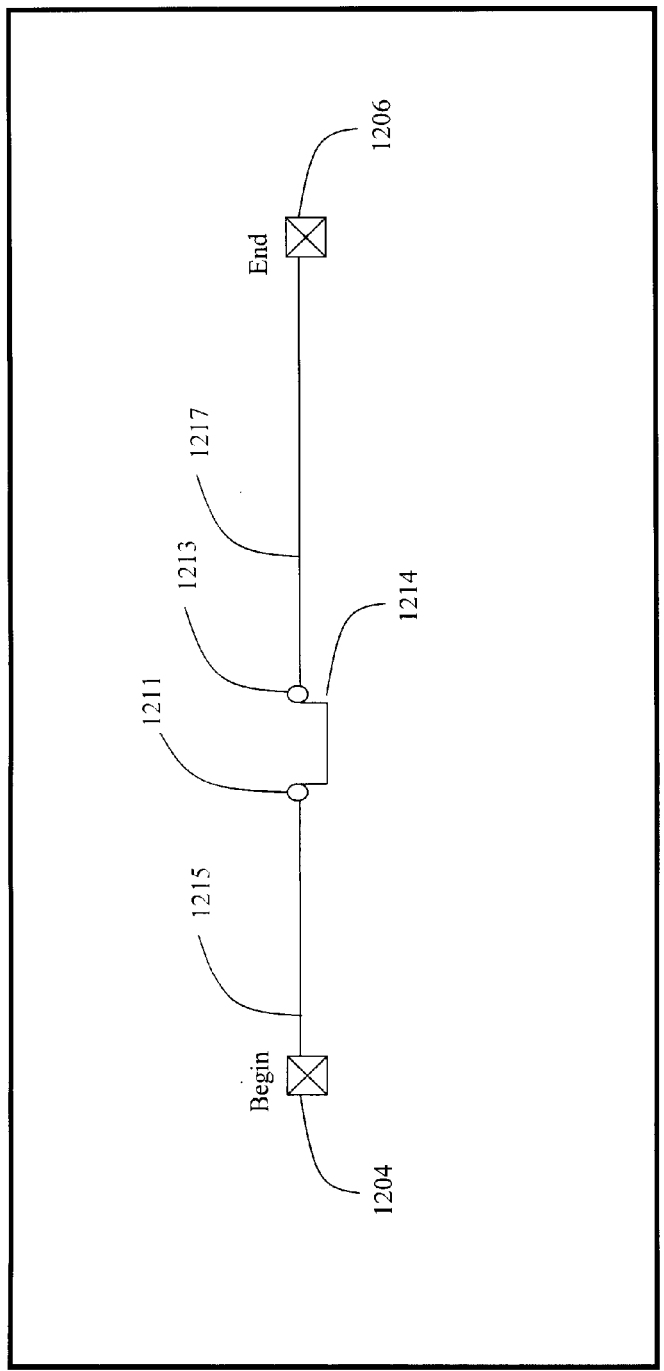
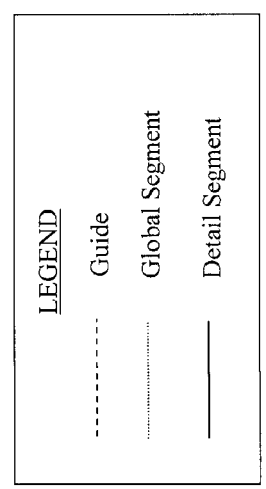
Fig. 14

METHOD AND SYSTEM FOR IMPLEMENTING PARTIAL RECONFIGURATION AND RIP-UP OF ROUTING

CROSS-REFERENCE TO RELATED APPLICATIONS

The present application claims the benefit of U.S. Provisional Application Ser. No. 60/795,794, filed on Apr. 28, 2006. The present application is related to U.S. application Ser. No. 11/741,668 entitled "Representation, Configuration, and Reconfiguration of Routing Method and System" and U.S. application Ser. No. 11/741,694 entitled "Method and System for Implementing Routing Refinement and Timing Convergence", both filed on even date herewith. Each of the above-referenced applications is hereby incorporated by reference in its entirety.

BACKGROUND AND SUMMARY

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design.

Chip designers often use electronic design automation (EDA) software tools to assist in the design process. Chip design using EDA software tools generally involves an iterative process whereby the chip design is gradually perfected. A top-down design methodology is commonly employed using hardware description languages (HDLs), such as Verilog or VHDL for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

Conventionally, routing is accomplished using area-based routing techniques, which is a rigid two-staged process of first performing global routing on an area followed by detail routing upon that same area. A global router does not normally make any specific connections, but provides a general plan for making the connections. During detail routing, the detailed router determines the exact location and layers for each interconnect, based upon the set of metal rules that have been provided to the chip designer.

One problem with conventional routers that use the two-stage global route/detail route approach is that there is a distinctive separation between the global router and the detail router which prevents effective and efficient interaction between the two types of routers. Another problem with conventional routers is that only two levels of granularity are available for routing, i.e., the granularity of global routes and detail routes, which may be too detailed or too coarse for certain types of desired routing activities.

To address these and other problems of conventional routers, embodiments of the present invention provide an improved method, system, and article of manufacture for implementing routing for an electrical circuit and chip design. A routing architecture can be represented as a spectrum of different granular routing levels. Instead of routing based upon area, routing can be performed for specific routes or portions of routes.

According to some embodiments, different types of representation or levels of abstraction for the routing can be used for the same net or route. According to a particular embodiment, the different levels of abstraction includes guide representation, global segment representation, global via representation, detail segment representation, and detail via representation. In an embodiment, the levels of abstraction includes imaged geometry representation. In another embodiment, the levels of abstraction includes electrical characteristics representation.

According to some embodiments, partial topological reconfiguration, refinement, or rip-up for a portion of the integrated circuit design, where the portion is smaller than an entire route or net. The portion that is reconfigured may correspond to any granularity of size of the route or net.

According to some embodiments, non-uniform levels of routing activities or resources may be applied to route the design. In one embodiment, prioritization may be used to route certain portions of the design with greater levels of detail, abstraction, or resources than other portions of the design. This may be used, for example, to obtain fast analysis of timing for the routed design.

According to some embodiments, imaged geometry may be used to implement routing of an integrated circuit design. According to some embodiments, electrical representation may be used to implement routing of an integrated circuit design.

Some embodiments are directed to parallel processing of different portions of design.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of the invention and, together with the Detailed Description, serve to explain the principles of the invention.

FIGS. 12-17 illustrate partial reconfiguration of a route according to an embodiment of the invention.

DETAILED DESCRIPTION

The present invention provides a method and system for routing an electrical circuit design. In some embodiments of the present invention, a number of different abstractions or granularities for routing can be employed, with each granular routing level synergistically able to interact and work with any other granular routing level to route paths in an electronic circuit. While the present explanation uses an example routing architecture that shows a specific combination of granular levels, it is noted that other and additional combinations of granular routing levels may be-employed within the scope of the invention.

The number, type, and granularity of the different routing levels can be chosen to be as incremental as needed to fulfill desired performance characteristics to route nets in a circuit. One advantage provided by this approach is that incremental changes can be made to a routing representation during the process of routing a circuit. During the routing process, information is acquired over time that may affect the specific routing characteristics of a net. Having a number of different routing granularities allows an incremental approach for routing, which enables minimal perturbance to the routing representation as changes are made during the routing process.

Unlike conventional approaches that segregate different types and granularities of routing representations (i.e., into a fixed division between global routes and detail routes), any combination of granular routing levels can be used to represent a route according to the present embodiment of the present invention. During the routing of a circuit, portions of that circuit can be represented using both higher and lower levels of granularities.

Different portions of a net may not always need to be routed using the same level of priority or attention at any given point in time. Embodiments of the present approach allow a designer/system to efficiently concentrate the routing process upon portions of the net with suitable levels of attention and resources, while concurrently concentrating more or less attention upon other portions of the net. Therefore, during the routing process, an intermediate representation of a route for a net may have portions that include a substantial amount of detail, while also having portions that have almost no routing details. This is in sharp contrast to conventional routers that generally follow a rigid path of first performing global routing on an area of a chip before performing any detail routing on that same area of the chip.

Figure 1:
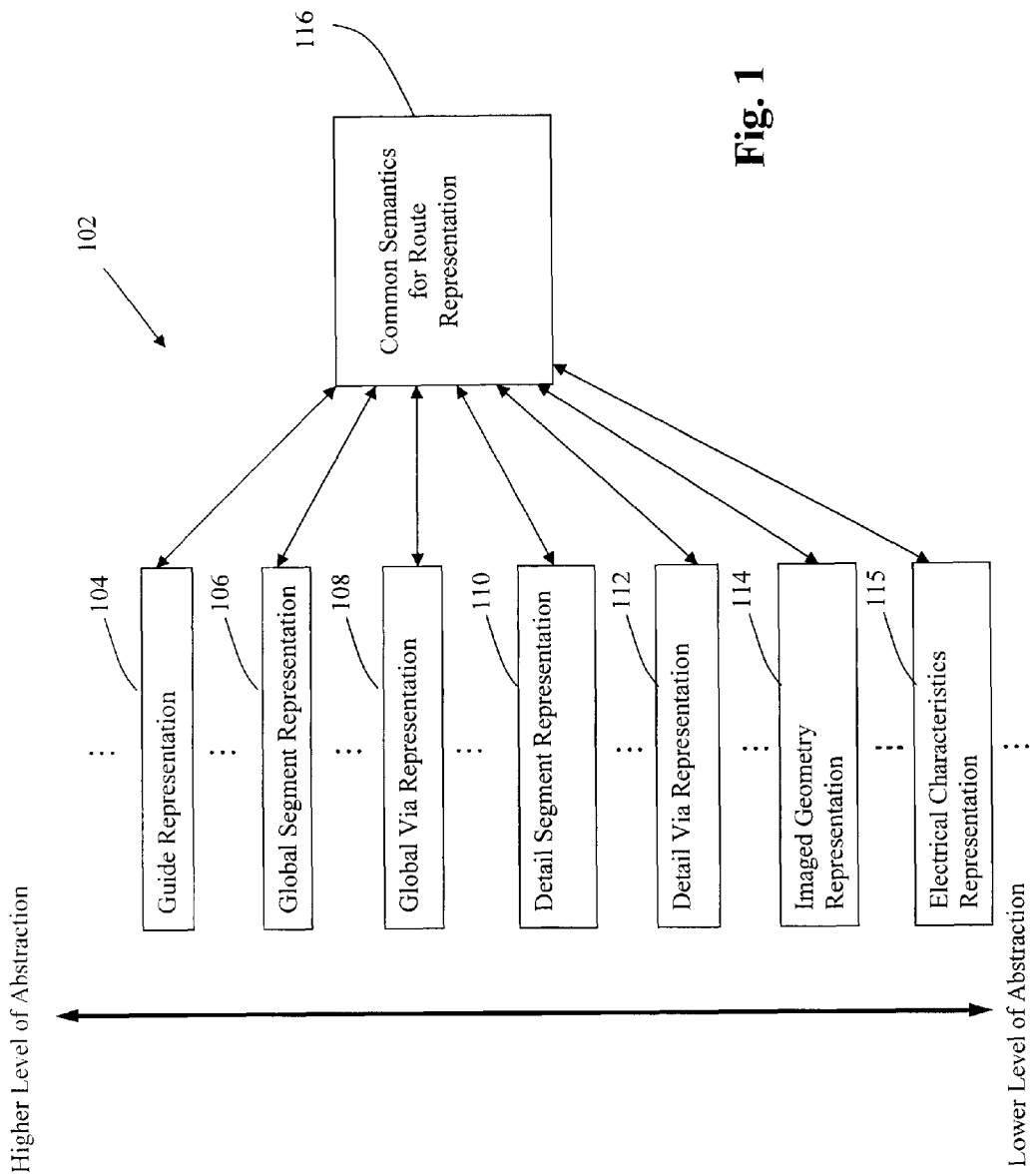
FIG. 1 shows an approach for implementing representation of routing according to one embodiment of the invention.

FIG. 1 shows an approach for representing a routing architecture 102 according to one embodiment of the invention. As noted above, a spectrum of different abstraction levels can be used in the present routing architecture. The different granular routing levels shown in FIG. 1 are the Guide representation 104, Global Segment representation 106, Global Via representation 108, Detail Segment Representation 110, Detail Via Representation 112, Imaged Geometry representation 114, and Electrical Characteristics Representation 115. These different levels of routing abstraction are generally presented in an order going from least detailed to more detailed, although depending upon specific preferences, the ordering may change.

Each granular routing representation is based upon a common set of semantics 116 for representing a route. Every granular routing level uses a common set of routing semantics to route a net or a portion of a net. This allows data relating to any level of routing abstraction to interact and connect with the data for any other level of routing abstraction.

There is commonly represented data that is associated with overall semantics for a net. For example, identification is made of the element that touches a first terminal/connection object, which is the "begin" routing element. Identification is made of the element that touches the second or ending terminal/connection object, which is the "last" or "end" routing element.

For each routing element, common semantics also apply to ensure that the end point and layer of a previous routing element will match up with the begin point and layer of the next routing element. In addition, commonly defined data storage elements are used to ensure that constraints can be adequately propagated between the different abstractions of routing levels.

Each of the example routing levels shown in FIG. 1 will now be described in more detail.

A Guide 104 is a routing representation at very high level of abstraction with only minimal specific details about the route for a net. Essentially, a Guide is an open in the route which represents a connection that is yet to be implemented. The Guide provides a high-level placeholder that indicates where further routing is required in the future between two points.

A Guide representation 104 includes a begin point and an end point. The Guide can have any angle and overlap any object. In one embodiment, a first type of Guide is implemented that has no specific layer assignments. Therefore, this type of Guide has properties associated with both segments and vias. In an alternate embodiment, a constrained Guide is implemented that forces a layer assignment, i.e., a Guide having From-To layers specified in its routing representation.

Rules can be modified and assigned to a net or route, and thus inherited by a Guide (or any other routing representation). Examples of such rules include width, spacing, and number of cuts rules. These rules can be used to further prescribe requirements of the design such as timing, noise, and yield requirements.

During global routing, Guides (or one or more portions of a Guide) are replaced with global route elements such as Global Segments 106, Global Vias 108, and Steiner points. The global router attempts to satisfy a layer-assigned guide constraint (e.g., (a) a two point connection with M1 From-Layer and M2 to-layer designation, or (b) M1 pin to M1 pin guide with layer assignment M4-M5) by restricting the global router to a single layer or a layer-pair constraint for as much of the route as possible.

A Global Segment 106 provides a globally routed wire-segment for a net or a portion of a net. The representation of a Global Segment uses the common routing semantics 116, and includes a begin point and an end point. In some embodiments, the Global Segment suggests a particular geometric area and is located on a single layer, but may not necessarily be DRC (design rule check) correct. In one embodiment, the Global Segment is routed in orthogonal routing directions, e.g., using Manhattan routing principles. Alternatively, the Global Segment is routed using non-orthogonal and diagonal angles, e.g., based upon the X routing architecture.

A Global Via provides a globally routed connection between two layers. The representation of a Global Via uses the common routing semantics 116, and includes a begin layer and an end layer. The representation of a Global Via also includes a suggested begin point and a suggested end point, which should be at the same location, but may not necessarily be DRC correct. In some embodiments, the Global Via could be associated with one or more offsets, such that wiring may couple to the Global Via at different locations on different layers. The Global Via could correspond to an area rather than a single point on a given layer.

Steiner locations are used to force a particular topology for a route or to form a connection between two or more different routes. Steiner points are optionally suggested based upon factors such as slack, degrees of freedom, user-preference for specific pin-to-pin connections. The global router attempts to connect the Steiner location but if it is not desirable, it expands the area until a successful connection can be made.

During detail routing, Detailed Segments 110 and Detailed Vias 112 are provided or generated with a more detailed abstraction than Global Segments and Global Vias. The detail routing creates wires with specific model-based criteria. Detail routing rules, such as segment widths and spacing, can be further refined. Printing rules, such as minimum-jog length and width enclosures, can also be enforced and validated (checked) prior to transformation into imaged geometry.

A Detail Segment 106 provides a detail routed wire-segment for a net or a portion of a net. The representation of a Detail Segment uses the common routing semantics 116, and includes exact expected geometries for a wire segment. The Detail Segment also includes a begin point and an end point. In some embodiments, the detailed segment provides an absolute identification of a layer and geometric area/location, and this location is expected to be DRC correct, although the detailed segment may still be changed during printing. Like global segments, in one embodiment, the Detail Segment is routed in orthogonal routing directions, e.g., using Manhattan routing principles. Alternatively, the Detail Segment can be routed using non-orthogonal and diagonal angles, e.g., based upon the X routing architecture.

A Detail Via provides specific geometries for a connection between two layers for a portion of a net. The representation of a Detail Via uses the common routing semantics 116, and includes a begin layer and an end layer as well as a via location (which is the common begin and end point of the via). In some embodiments, the Global Via could be associated with one or more offsets, such that wiring may couple to the Global Via at different locations on different layers. The Global Via could correspond to an area rather than a single point on a given layer.

Even lower levels of routing granularity having greater levels of detail can be employed in the present embodiment of the invention. For example, an imaged geometry 114 can be employed to represent the actual physical geometric appearance of all or part of a route. Using the common semantics, the imaged geometry is associated with a begin and end point that ties into its immediately preceding and succeeding routing element within the route. With the imaged geometry representation, additional information may also be maintained for relationships to neighboring geometries. This is because the lithographic effects of manufacturing the shapes on the IC causes neighboring shapes to influence the final imaged geometry of routes on the IC chip.

Electrical characteristics 115 may also be used as an abstraction level when representing routes. For example, the RC and crosstalk characteristics of routing segments can be captured and represented with the set of common semantics to associated electrical characteristics to a route. With electrical characteristics, additional information may also be maintained relating to neighboring routes and shapes in the design. This representation allows one to perform, for example, crosstalk-aware routing.

Figure 2:
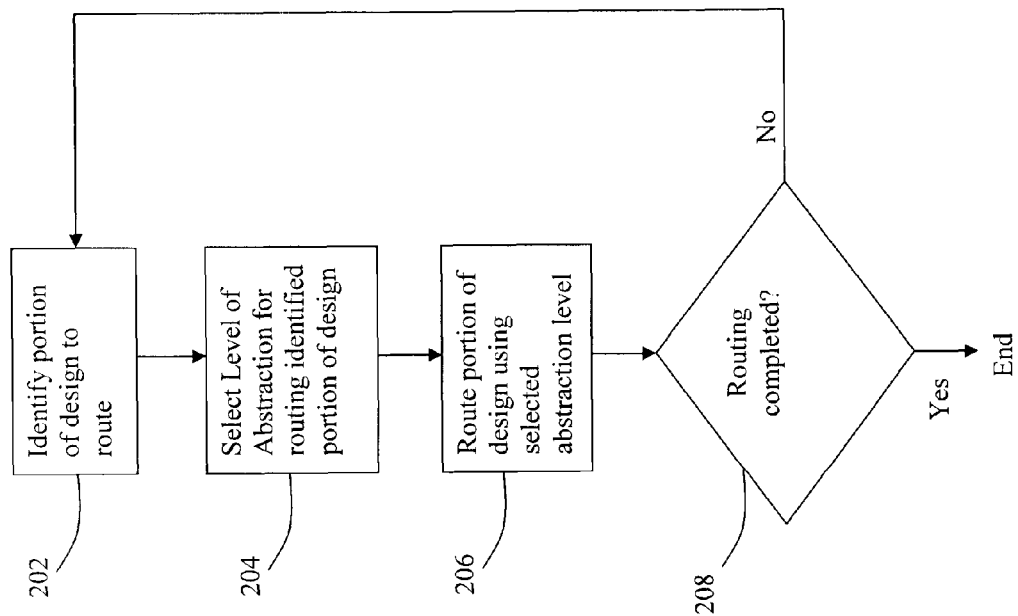
FIG. 2 shows a flowchart of a process for incremental routing according to one embodiment of the invention.

FIG. 2 shows a flowchart of a process for routing according to a present embodiment of the invention. At 202, a portion of a design is identified for routing. One advantage of the present invention is that a single net may be routed in an incremental fashion, with different portions of the net being handled at different priority and abstraction levels at any given point in time. Therefore, action 202 may refer to the selection of an entire net to route, or may refer to identification of a subset or portion of a net that needs to be routed.

A level of abstraction is selected to route that identified portion of the design (204). Examples of different granularity/abstraction levels include those shown in FIG. 1, such as Guides, Global Segments, Global Vias, Detail Segments, and Detail Vias.

In some implementations, at the beginning of the process, the net would probably be routed at the highest levels of abstraction, e.g., using one or more Guides or global routing elements. Once the initial routing actions have been taken, it is likely that lower and more detailed levels of abstraction would be used to route portions of the net.

However, it is not necessary to begin by routing at the highest level of abstraction, and indeed, it may be advantageous to begin by routing certain portions of the design at much lower levels of abstractions (even if concurrently routing other areas of the design at higher levels of abstraction). For example, it may be desirable to route critical areas of the design or areas of the design that may be difficult to route with lower levels of abstraction, even though lower level routing (such as detailed routing) is typically slower and more resource intensive than higher level routing (such as global routing or guide routing). One reason this is advantageous is because this ensures that critical areas of the design are adequately routed and laid out up-front, without necessarily being concerned about and/or having to address interferences or blockages from geometric structures from less-critical areas of the design.

The selected level of routing abstraction is used to route the identified portion of the design at 206. At 208, a determination is made whether routing is complete or if there are still portions of the net that need to be routed. If so, then the process returns back to 202 to identify the same or different portion of the design to undergo additional routing.

Figure 3:
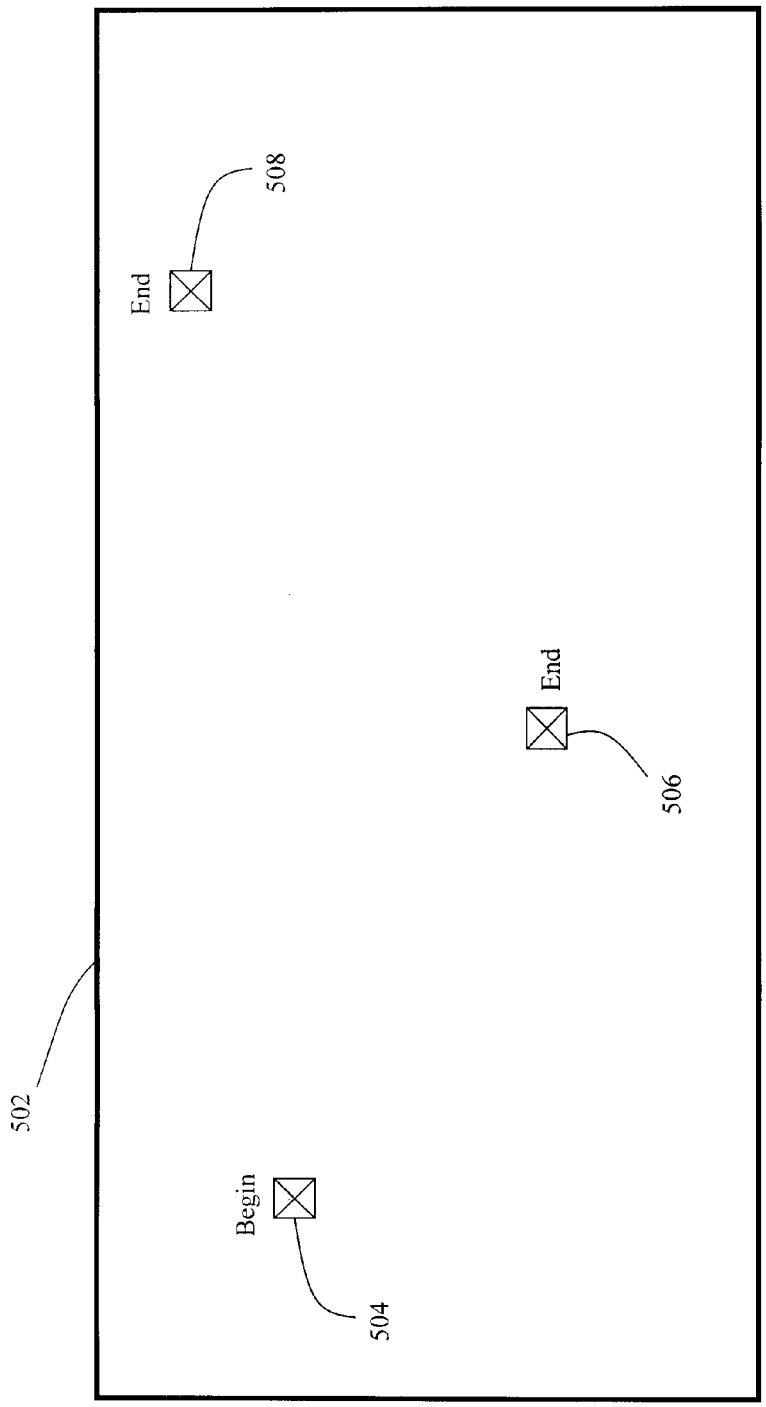
FIGS. 3-10 illustrate routing according to an embodiment of the invention.

An illustrative example of an embodiment of the invention will now be provided. Referring to FIG. 3, shown is an area 502 of a design having three points that need to be connected together, which are displayed as terminals 504, 506, and 508. For the sake of facilitating an explanation of the invention, assume that all three terminals 504, 506, and 508 are on the same layer, although the principles described herein are applicable to routing for multiple layers. Terminal 504 has been designated as a begin point and terminal 506 and 508 have been designated as end points.

Figure 4:
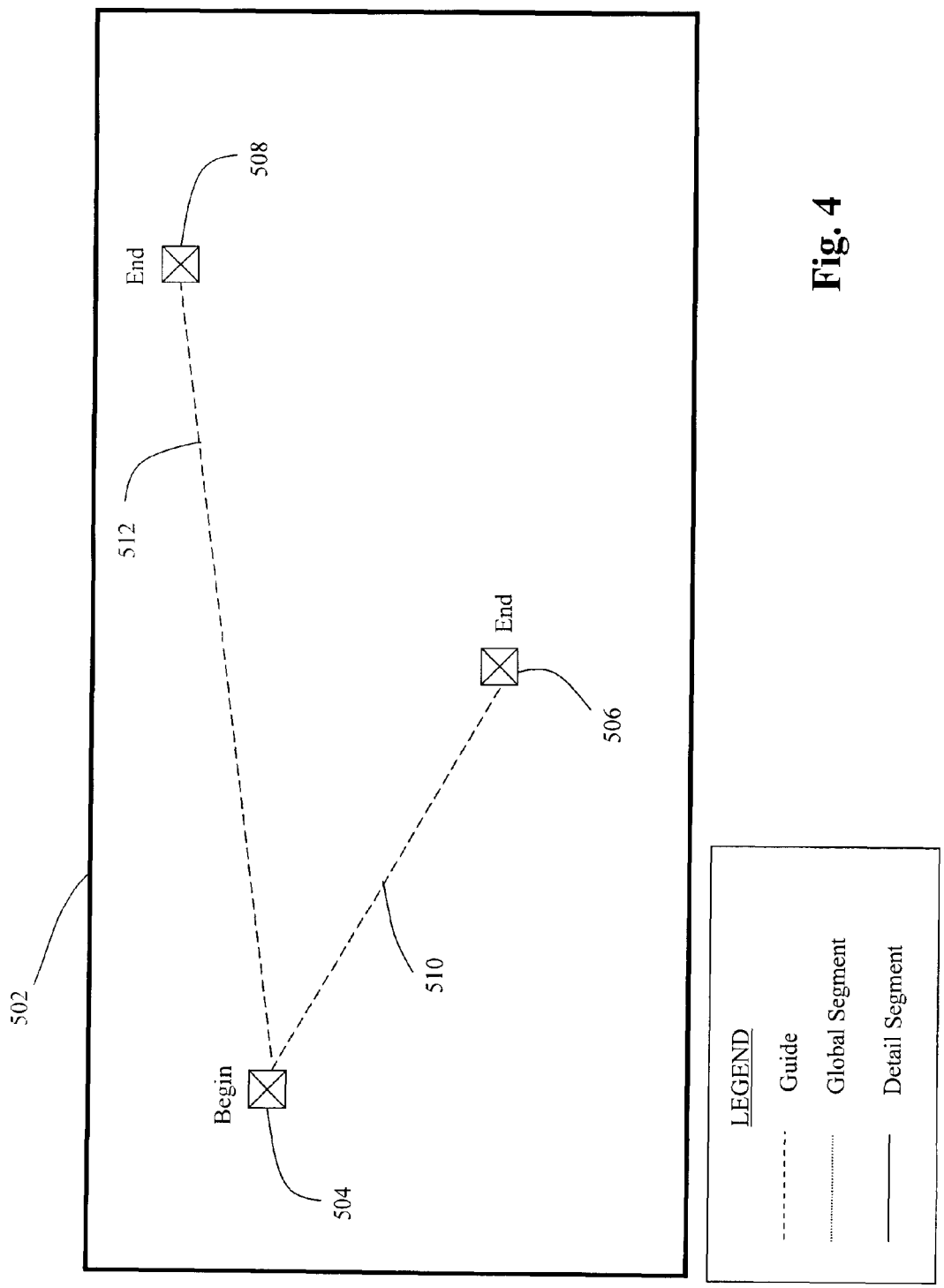

To begin routing this area 502 of the circuit, one or more Guides are used to represent connections between the terminals 504, 506, and 508. Shown in FIG. 4 is a Guide 510 that extends between terminal 504 and terminal 506. Guide 510 is represented A Guide 512 extends between terminal 504 and terminal 508. For the purposes of this explanation, Guides are shown as dashed lines in the figures.

As noted above, a Guide is a routing element at a very high level of abstraction, which generally identifies a route that is yet to be implemented between two points. Therefore, while there may be rules associated or implicit with the Guide to assist in further routing activities, there is little or no specific detail for the eventual route that is associated with the Guide. The Guide essentially provides a placeholder that identifies a portion of the net that requires further routing activities at some point in the future.

Because the Guide represents an unknown route, the Guide can be implemented with few physical restrictions. For example, Guides 510 and 512 are shown as extending directly between terminals 504, 506, and 508, with minimal constraint upon the exact angle or path topology for the Guides 510 and 512. The representation of Guide 510 includes a begin point at the location of terminal 504 as well as an end point at terminal 506. Since terminals 504 and 506 are on the same layer in this example, the start layer and end layer for Guide 510 would have the same value. The representation of Guide 512 includes a begin point at the location of terminal 504 and an end point at terminal 508. Because terminals 504 and 508 are on the same layer in this example, the start layer and end layer for Guide 512 would have the same value.

Even at the high abstraction level of a guide, certain types of analysis can be made. For example, a determination can be made whether a guide is even possible between the points that need to be connected. If a guide is not possible for a portion of a design, then a serious routing problem has been identified, and there is no need to spend any additional resources for more detailed routes until that problem has been solved.

Further topological refinements are made to the guides in order to route the design. Layer assignments and global routes would be defined for routes associated with the guides. This, in turn, starts collection of information that can be made for further analysis and optimizations, e.g., for timing, yield, etc.

Figure 5:
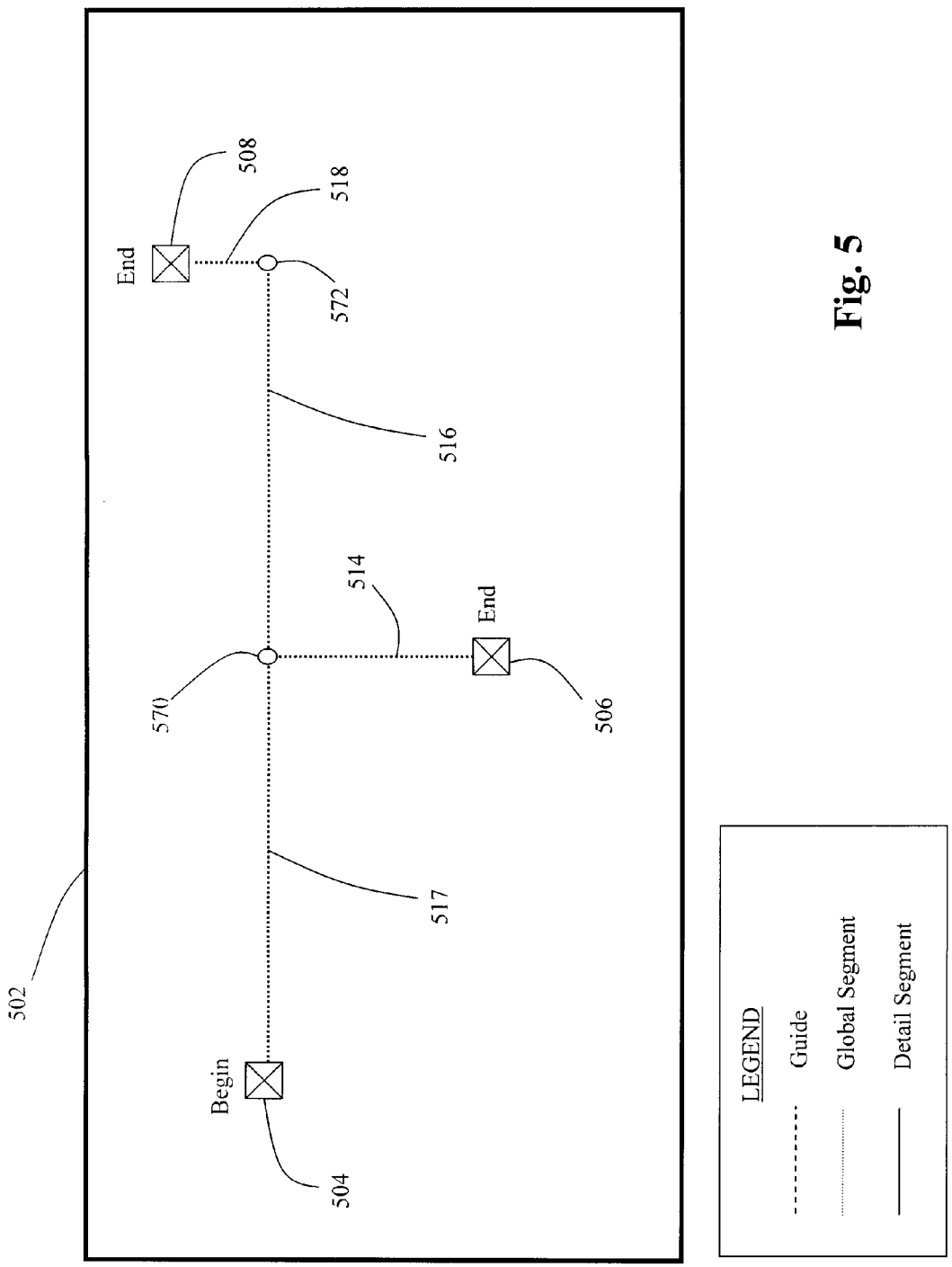

FIG. 5 shows an example approach for global routing the Guides 510 and 512 of FIG. 4. Based upon any layer-assigned guide constraints and Steiner point constraints that might exist, Guides 510 and 512 have been replaced with Global Segments 517, 514, 516, and 518. Global Segment 517 routes from terminal 504 to location 570. Global Segment 514 routes from location 570 to terminal 506. Global Segment 516 routes from location 570 to location 572. Global Segment 518 routes from location 572 to terminal 508.

The representation of Global Segment 517 includes a begin point at the location of terminal 504 as well as an end point at location 570. The semantics of the present routing representation ensures that the end point of the present routing element (Global Segment 517) matches with the begin point of the subsequent routing element for the net (Global Segments 514 and 516). The overall semantics of the present routing representation cause an identification of Global Segment 517 as the beginning element in the route for the present net.

The representation of Global Segment 514 includes a begin point at location 570 as well as an end point at terminal 506. The semantics of the present routing representation ensures that the begin point of the present routing element (Global Segment 514) matches with the end point of the preceding routing element for the net (Global Segments 517). The overall semantics of the present routing representation cause an identification of Global Segment 514 as the end element in the present route.

The representation of Global Segment 516 includes a begin point at location 570 as well as an end point at location 572. The semantics of the present routing representation ensures that the begin point of the present routing element (Global Segment 516) matches with the end point of the preceding routing element (Global Segments 517). In addition, the semantics ensure that the end point of the present routing element matches with the begin point of the subsequent routing element (Global Segments 518).

The representation of Global Segment 518 includes a begin point at location 572 as well as an end point at terminal 508. The semantics of the present routing representation ensures that the begin point of the present routing element (Global Segment 518) matches with the end point of the preceding routing element for the net (Global Segments 516). The overall semantics of the present routing representation cause an identification of Global Segment 518 as the end element in the present route.

The present embodiment of the invention allows portions of the design to be routed in a non-uniform manner, in which different portions of the design receive a different level of priority or attention at any given point in time as compared to other portions of the design. Therefore, the designer/system can efficiently concentrate the routing process upon portions of the net with suitable levels of attention and resources, while concurrently concentrating more or less attention upon other portions of the net.

Referring to FIG. 4, for example, it can be seen that one of the Guides 510 or 512 could have undergone extensive routing from global routing to detail routing before ever addressing further routing for the other guide, depending upon the relative routing priorities between the two guides.

Referring to FIG. 5 as another example, depending upon the relative routing priorities, any of the global segments may receive more resources and attention for detail routing before addressing the other global segments. In FIG. 5, assume that the highest priority is to first provide detail routing corresponding to Global Segment 514. Using the present embodiment, the router can incrementally focus the use of system resources to only perform detail routing upon the portion of the route associated with Global Segment 514, and not upon any of the other route portions.

Figure 6:
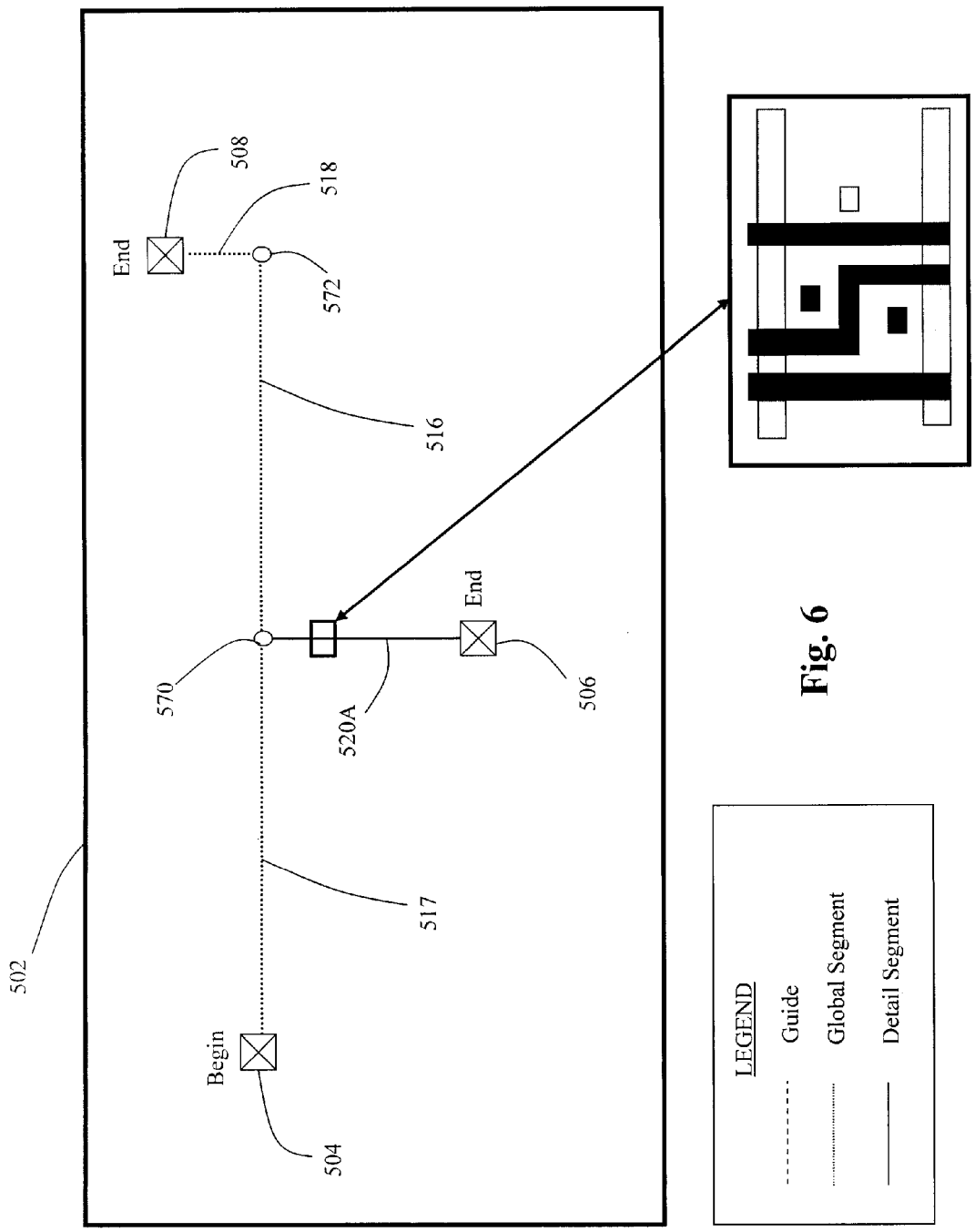

Shown in FIG. 6 is a revised version of this configuration in which detail routing has been performed upon just Global Segment 514, and a Detail Segment 520A has been inserted in its place.

Figure 7:
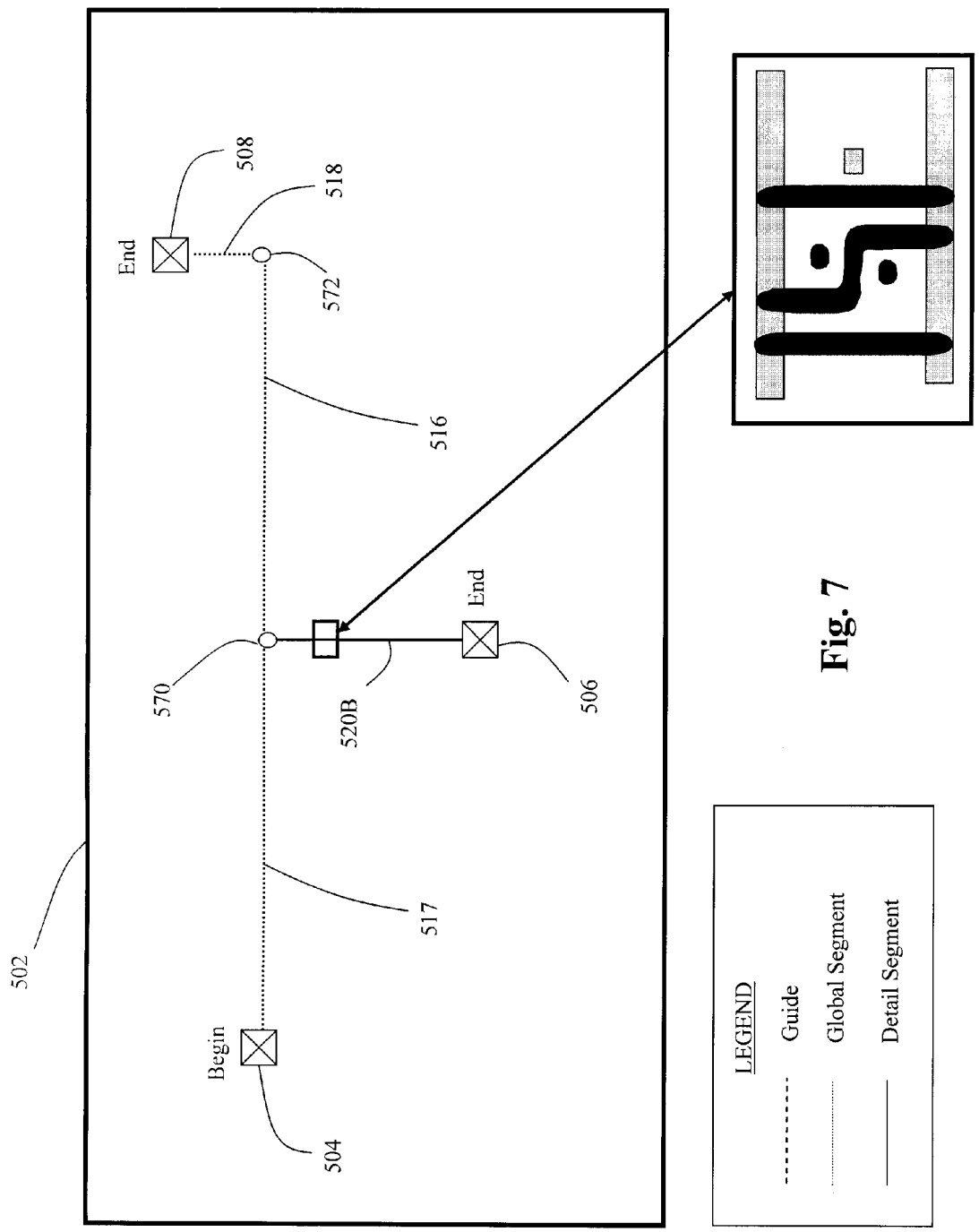

Even further refinement of this portion of the route can occur before concentrating resources upon other portions of the design. Assume that it is desired to further refine the representation of routing for the portion of the design associated with Detailed Segment 520A. An additional level of granularity that might be used to make this representation is to provide the actual or estimated imaged geometry for this segment. Referring to FIG. 7, shown is an imaged geometry representation 520B for this portion of the design.

Another feature of the present embodiment is that a route can be concurrently represented using routing elements at multiple different levels of abstraction. As can be seen in FIGS. 6 and 7, the present representation of the route extending from terminal 504 to terminal 506 includes both a global segment (Global Segment 517) as well a more detailed segments (Detail Segment 520A or Imaged Geometry 520B).

Consider the route to be established between terminal 504 and terminal 508. At this point, this portion of the design has been globally routed using Global Segments 517, 516, and 518.

As noted above, one of the advantages of the present approach is that, given the semantics of the routing representation, specific portions of the design can receive more routing resources and concentration as compared to other portions of the design. To provide another illustration of this advantage, consider if terminals 504 and 508 are pins. Further assume that the criticality of routing the portion of the route directly adjacent to the pins is much less critical than routing the central part of the route between the two pins. In this circumstance, a system should ideally be able to concentrate its initial efforts to route the middle portion of this route, and only later have to focus upon the portion of the route near the pins.

Figure 8:
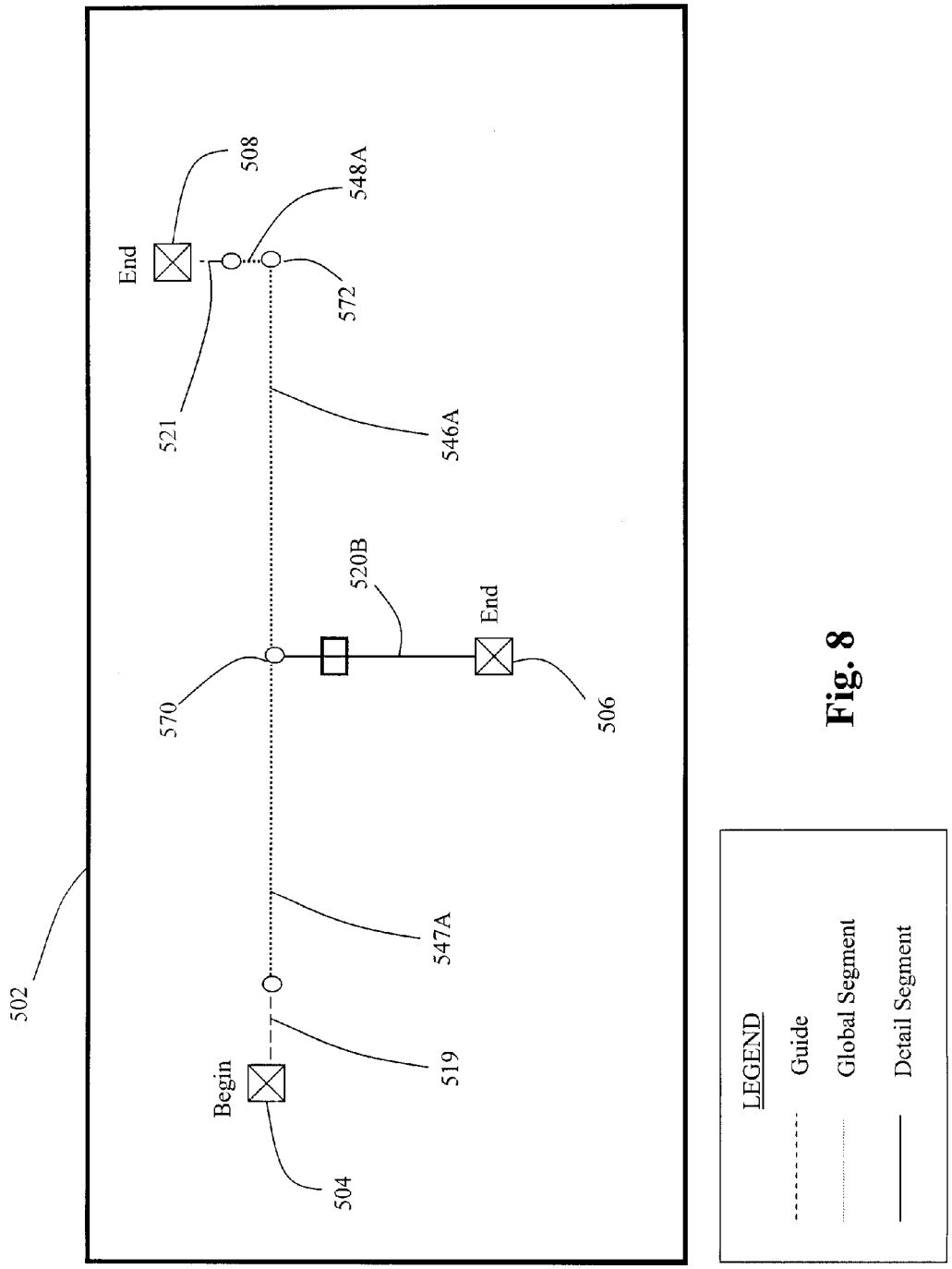

Referring to FIG. 8, one example approach to accomplish this prioritization is to change the portion of the route near pins/terminals 504 and 508 into guides, e.g., Guide 519 adjacent to terminal 504 and Guide 521 adjacent to terminal 508. The remaining portions of the route between these two terminals are kept as Global Segments 547A, 546A, and 548A that can be further refined. The guide portions are essentially left as placeholder routing elements that will be handled at a later point in time. Therefore, in this example situation, we have the unconventional progression of first representing a portion of the route near a pin as a guide, then moving to a less abstract representation as a global segment, and then back to a more abstract representation as a guide again before further routing is performed.

Here, the representation of Guide 519 includes a begin point at the location of terminal 504 and an end point at the beginning of the subsequent routing element, i.e., the being point of Global Segment 547A. The overall semantics of the present routing representation cause an identification of Guide 519 as the beginning element in the route for the present net. The representation of Global Segment 547A includes a begin point at the end of the preceding routing element, i.e., Guide 519, and an end point at the beginning of the next routing element, i.e., location 570 which is the begin point of the Global Segment 546A. The representation of Global Segment 546A includes a begin point at the end of the preceding routing element, i.e., Global Segment 547A, and an end point at the beginning of the next routing element, i.e., location 572 which is the begin point of the Global Segment 548A. The representation of Global Segment 548A includes a begin point at the end of the preceding routing element, i.e., Global Segment 546A, and an end point at the beginning of the next routing element, i.e., the begin point of Guide 521. The representation of Guide 521 includes a begin point at the end of the preceding routing element, i.e., Global Segment 548A, and an end point at the location of terminal 508. The overall semantics of the present routing representation cause an identification of Guide 521 as the end element in the route for the present net.

Figure 9:
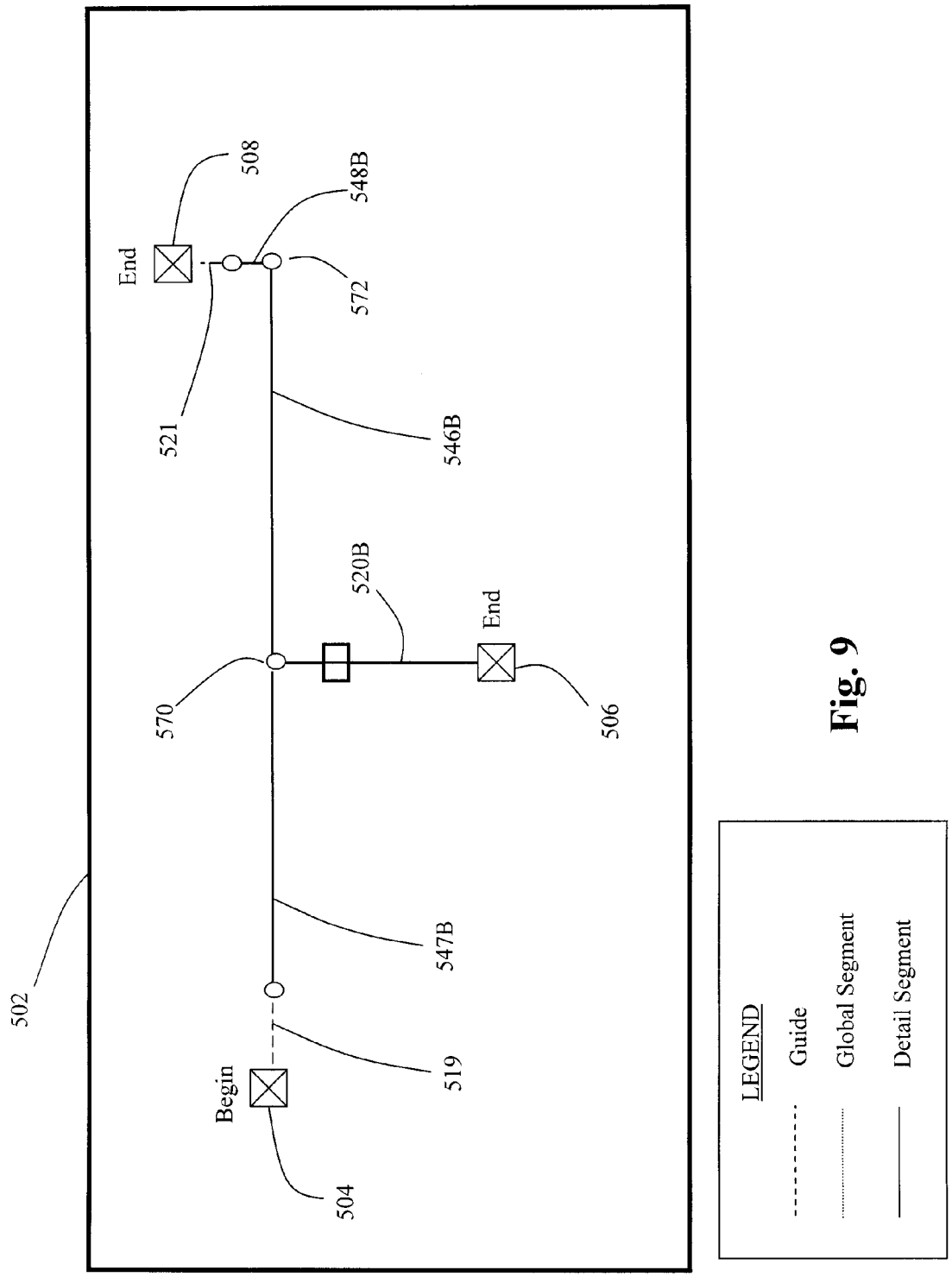
Figure 10:
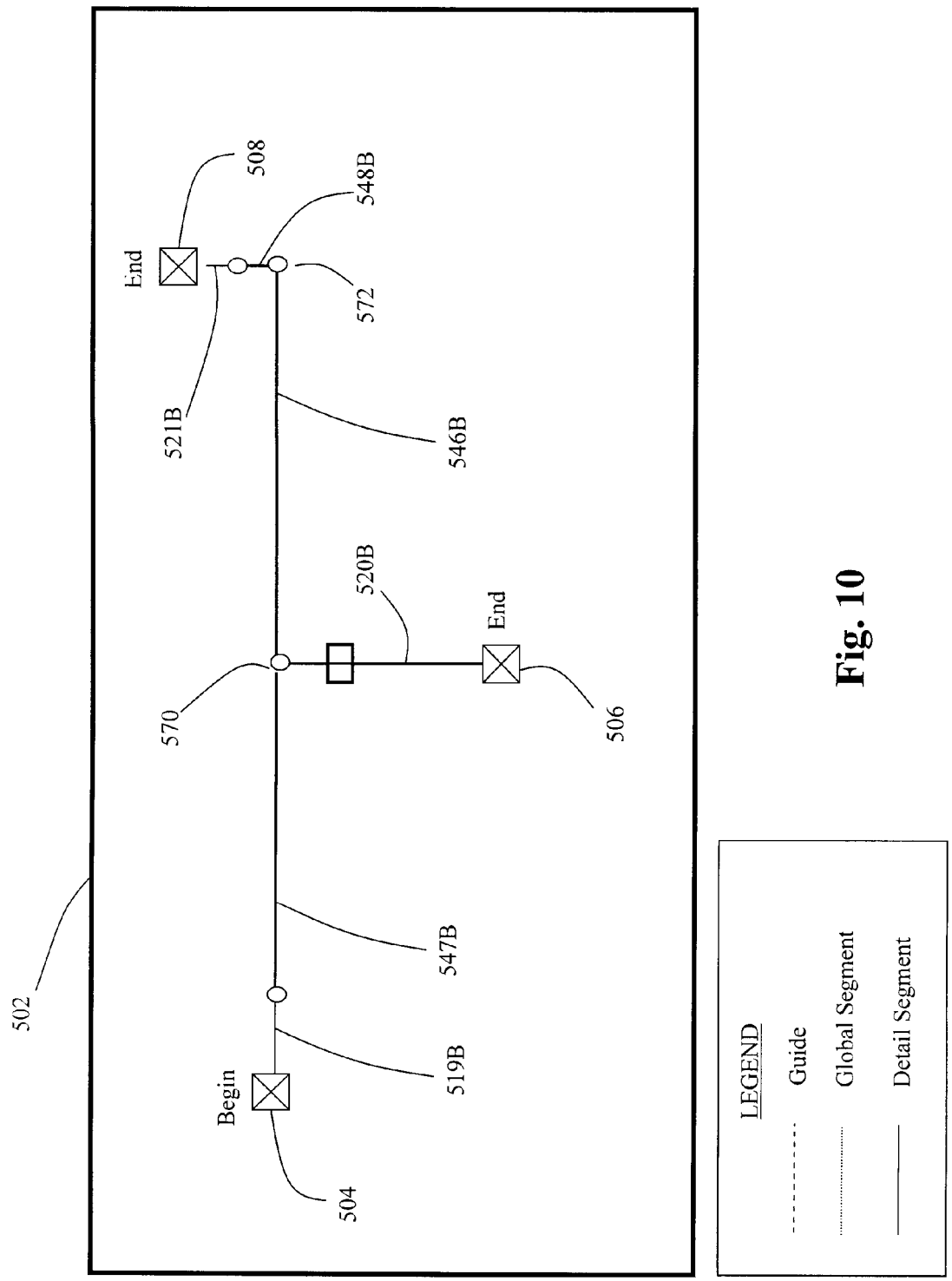

As shown in FIG. 9, the Global Segments 547A, 546A, and 548A in the middle portions of the route between terminals 504 and 508 can be further refined as necessary before addressing the portions associated with Guides 519 and 521. Therefore, detail routing is performed upon Global Segments 547A, 546A, and 548A to obtain Detail Segments 547B, 546B, and 548B. Thereafter, the portions of the route near the pins, i.e., Guides 519 and 521, can be refined by using both global routing and then detail routing. FIG. 10 shows Detail Segment 519B routed for the portion adjacent to terminal 504 and a Detail Segment 521B routed for the portion adjacent to terminal 508.

As noted extensively above, some embodiments of the invention allows portions of the design to be routed in a non-uniform manner, in which different portions of the design receive a different level of priority or attention at any given point in time as compared to other portions of the design. This means that one or more of the routes or portions of routes can receive more or less attention or resources as compared to other routes or other portions of routes. More system resources, e.g., CPU resources, may be focused upon portions of the net that merit such increased attention or resources, e.g., that are deemed more critical or that are expected to provided greater informational/analysis return from the investment in resources. Less resources or attention would be given to portions that merit less resources or attention, e.g., less critical portions or portions that would not provide enough return of information or analysis from the additional resources or attention.

Figure 19:
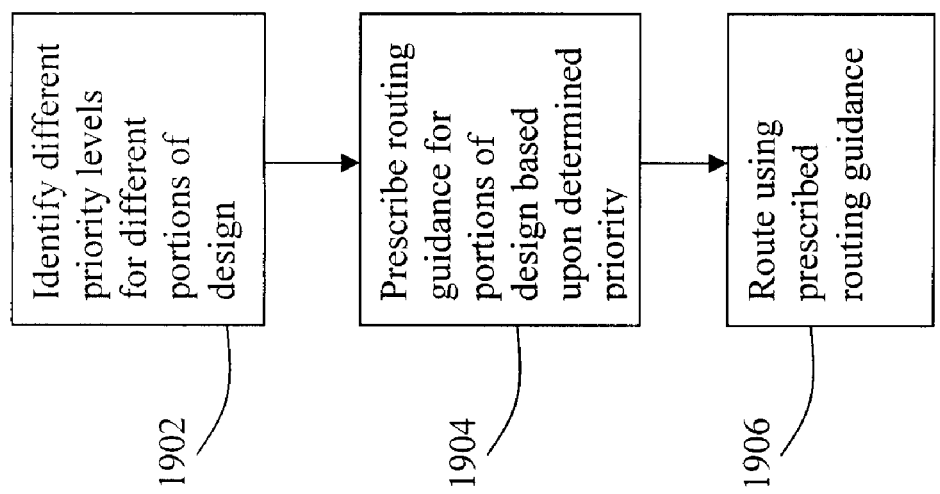
FIG. 19 shows a flowchart of a process for prioritizing routing according to an embodiment of the invention.

FIG. 19 shows a flowchart of a process for performing such priority-based routing. At 1902, identification is made of different priority levels for different portions of a design. As noted above, one advantage of the present invention is that a single net may be routed in an incremental fashion. Therefore, different portions of the net can be handled at different priority and abstraction levels at any given point in time. Any suitable criteria may be used to determine the priority level of a net or portion of a net. For example, if timing is a factor under consideration for determining priority, then the criticality of a net may be considered to determine priority.

At 1904, guidance will be prescribed to the routing process/system based upon the priority determination. This may be effected as a set of one or more rules that guide the routing process. For example, the rules may identify certain nets or portions of a net as requiring earlier processing for more detailed levels of abstraction, as compared to other nets or other portions of the net. This type of rule provides guidance relating to the amount or proportion of system resources that would be applied to certain portion of the design. The rules may also identify certain portions as requiring certain width or spacing values or thresholds as compared to other portions.

At 1904, routing is performed using the prescribed guidance. At this point, certain nets or portions of nets have been identified as high priority portions. These identified portions would receive earlier and increased system resources for routing to more detailed routing levels. Other portions may be specified as having lower priority levels. These lower priority portions may receive less resources, to the point of even remaining as Guides or Global Routes.

As noted above, it is not necessary to begin by routing at the highest level of abstraction. In this present example, the high priority portions may be routed at much lower levels of abstractions, even if other lower priority portions are being routed at higher levels of abstraction. This ensures that the higher priority areas of the design are adequately routed and laid out, without necessarily being concerned about spending system resources on lower priority areas, particularly if those lower priority areas need substantial system rouses to route at more detailed levels, e.g., to address interferences or blockages from geometric structures.

This approach provides a significant advantage over conventional systems that require a rigid hierarchy of actions to generally address all global routing for an area before addressing detail routing for that same area. In contrast, the present embodiment allows the focus of system resources to be placed on specific routes or portions of routes, and further allows system resources to be used to concentrate on those with higher relative priorities.

Another advantage of this approach is that optimization goals can be reviewed and analyzed on an incremental basis. Examples of such optimization goals include timing, congestion, yields, etc. The present embodiment allows different portions of the design to undergo such analysis at different levels of detail from other portions of the design. For example, a specific portion of the entire route can undergo routing for a particular optimization goal before other portions of the design are addressed or are even globally routed. This is in contrast to conventional approaches that require an entire design or a area of a design to undergo a threshold amount of routing (e.g., global routing) before such optimizations can be made.

To illustrate, consider if it is desired to implement the routing process to promote timing optimization. The goal in one embodiment is to obtain a very quick view of the timing situation for the design, without having to detail route the entire design. The idea is, for example in one embodiment, to obtain at least 90 percent timing accuracy for timing analysis while expending only 10 percent of the resources to obtain the analysis.

Certain portions of the design are very sensitive to specific routing configurations or are more critical, and thus must be routed in great detail in order to obtain a generally accurate picture of the timing situation for the design. On the other hand, other portions of the design may not need much routing detail, if any, to provide accurate guidance for the timing analysis of the design. It would therefore make sense to devote greater routing resources to route the portions that require such resources, and devote less resources to those portions that do not need such resources in order to complete the analysis.

Since the present invention allows a intermixing of different abstraction levels for routing, this allows different portions of the design to be routed at different priority levels from other portions. By adjusting the level of resources based upon a priority determination, this provides a very fast way of getting an accurate view of timing for a given net or design.

It is also noted that if timing requirements cannot be met after routing of the critical nets or critical portions of nets, then the lower abstraction routing details really do not matter for the non-critical nets or non-critical portions of the nets. Therefore, this approach provides savings by not performing the more detailed routing of those non-critical regions.

Figure 20:
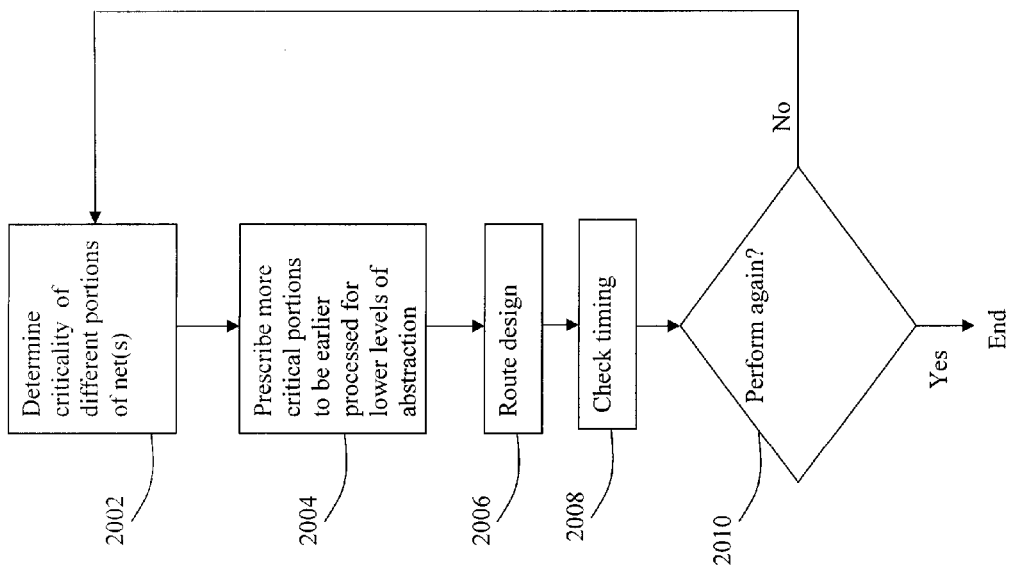
FIG. 20 shows a flowchart of a process for implementing timing optimized routing according to an embodiment of the invention.

FIG. 20 shows a flowchart of a process for this type of routing according to a present embodiment of the invention. At 2002, criticality of the different nets or portions of the nets are determined. Any suitable approach can be used to determine the criticality of a net in conjunction with the invention. For example, portions of the net that are likely to have cross-coupling problems are the regions of the design that may be considered critical for timing optimization purposes. On the other hand, portions of the net that will likely not have cross-coupling problems will be considered less critical.

There may be control over the dividing point for criticality of a net. For example, a particular timing value may be selected by a user. Any nets that are negative to that timing value are considered to be critical. Any nets that are positive relative to the selected timing value are not considered to be critical.

A 2004, more critical portions of the design are prescribed to be processed differently from less critical portions of the design. In particular, portions of the design that are likely to have cross-coupling issues are prescribed to be addressed earlier in the routing process at lower abstraction levels and with greater routing detail. The less critical portions are prescribed to receive minimal or modest amounts of resources, as needed to complete the analysis. Rules may be established that specify these prescriptions for portions of the design.

Additional design features may be prescribed for certain portions of the design. For example, width and spacing rules may be established, e.g., to provide greater timing optimization for certain critical portions of a net.

At 2006, routing is performed based upon the prescriptions established in 2004. For example, more CPU resources may be directed at an earlier point to provide more detailed routing for high criticality net portions, as compared to less critical net portions. Less critical portions may be routed at a very high level of abstraction. Specific spacing and widths rules may be applied for certain portions of the design.

At 2008, timing analysis is performed upon the routed design. The timing analysis provides an analysis of the timing for the design or net under examination. If desired, the process may loop back to 2002 and repeat, e.g., to change the routing plan by modifying some of the rules or criticality determinations if timing requirements are not met.

Some embodiments of the present invention also provide an approach for implementing partial reconfiguration or "rip-up" of a portion of a route. In some embodiments of the invention, such a reconfiguration can be performed, both at the same and at different levels of routing abstraction.

With conventional routing mechanisms, if a portion of a design needs to be modified, then reconfiguration is performed against an entire route, net, or design. This means that the entire route will be re-implemented if any portion of the route needs to be re-routed. This is highly inefficient if only a very small fraction of the design needs to be re-routed or modified and may result in extensive over-perturbance to the rest of the design.

Some conventional routing mechanisms use one or more switchboxes to route a design. However, switchboxes merely provide an entire "route" or "net" within a box, while providing connections to other "routes". In effect, the switchbox provides a fixed level of granularity at which routing must be addressed, which is at the level of the entire route addressed by the switchbox. Again, this is inefficient if only a portion of the route addressed by the switchbox needs to be re-routed, rather than the entire switchbox.

Embodiments of the present invention allow reconfiguration to be performed against any element, portion of an element, or portion of a route, rather than requiring the reconfiguration to be performed against the entire route. This is facilitated by the previously-described approach for representing different portions of the net at different priority and abstraction levels at any given point in time.

Figure 11:
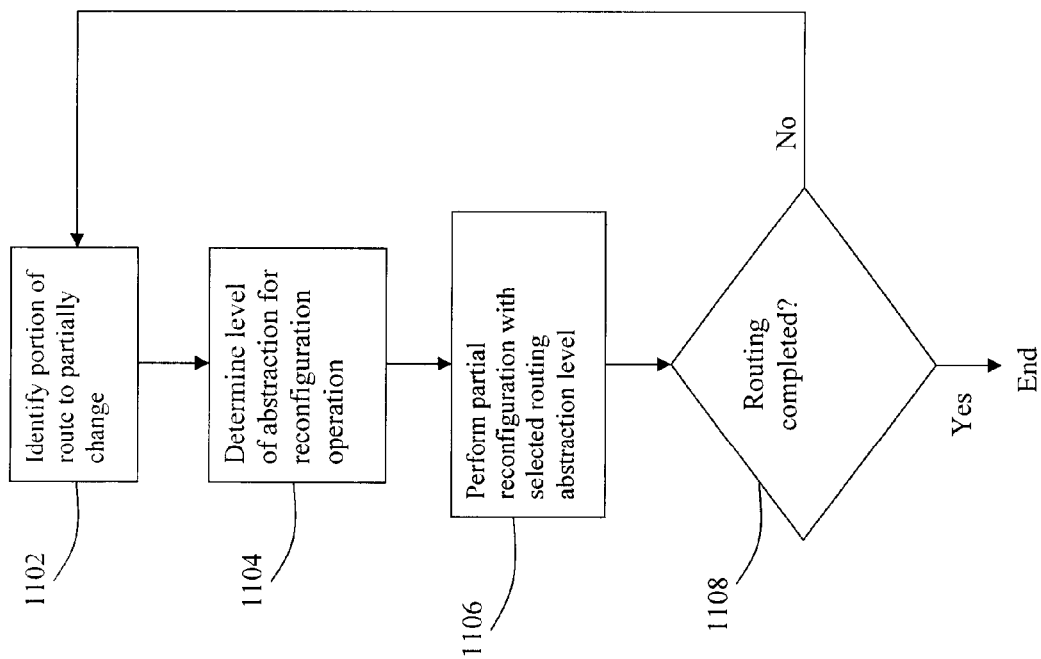
FIG. 11 shows a flowchart of a process for performing partial reconfiguration of a route according to one embodiment of the invention.

FIG. 11 depicts a flowchart of a process for performing partial reconfiguration according to some embodiments of the invention. At 1102, identification is made of a portion of a route that is to undergo reconfiguration. Any portion of the route or net may be selected to undergo reconfiguration. One reason for performing the partial reconfiguration is to address specific routing problems that are identified along a portion of a route. Therefore, in one embodiment, partial reconfiguration is performed against an identified portion of a route for which a routing problem has been identified and possibly any neighboring geometries.

At 1104, a determination is made of the level of abstraction to use for the partial reconfiguration. Any level of routing abstraction can be utilized to perform the reconfiguration operation. Some factors to consider when determining the level of routing abstraction to use include, for example, minimizing the amount of perturbance to the rest of the design, the desired performance objectives, and the extent of the routing problem to be addressed. These factors may also be used to identify the specific portion of the partial route/segment to rip-up in 1102.

The level of abstraction that is chosen could affect the efficiency and/or performance of the reconfiguration process. Detail routing typically requires consideration of a large number of details and therefore may be slower and more resource-intensive, particularly over a comparatively large area of the design. However, the results of the detail routing process will generally place in the detailed route very close to a final solution. On the other hand, global routing can be performed much faster than detail routing, but will result in a set of routes that is only an approximate of a final acceptable route. Therefore, if the routing problem to be addressed is extensive, then it may be more efficient to first address the problem at a higher level of abstraction (e.g., with guides or global segments) before performing detailed routing. On the other hand, if only a very small portion of the route needs to be corrected and the routing problem is trivial, then it may be more efficient to go directly to a low level of routing abstraction to correct the problem.

Any level of abstraction may be chosen in 1104. The identified segment to be undergo partial reconfiguration is already at a given abstraction level. The level of abstraction to use for the partial reconfiguration may be at a higher level, lower level, or at the same level of routing abstraction as compared to the state of the original route data.

After the level of abstraction has been determined, the identified portion of the route undergoes reconfiguration using that level of routing abstraction at 1106. A determination is made at 1108 whether the routing for that portion of the design is complete. If so, then the process ends. If not, then the process returns back to 1102 to identify a portion of the design to undergo partial reconfiguration. It is noted that either the same or a different portion of the design may be chosen in the next pass of the process to undergo the partial reconfiguration.

To illustrate this aspect of performing partial rip-up, consider the detail segment 1210 shown in FIG. 12 that extends from a Start terminal 1204 and ends at an End terminal 1206. Assume that a routing problem has been identified for the portion of the route contained within box 1208.

One approach to accomplish this partial reconfiguration is to change just the portion of the route within box 1208, without affecting any other part of the detail segment 1210. Any level of abstraction may be chosen to correct the portion of the route within box 1208. Referring to FIG. 13, shown is a partial reconfiguration which is accomplished by first performing a global route to determine global segments 1212 to substitute for the original detail segments within box 1208. This moves up the routing abstraction level to perform the partial rip-up.

Here, the representation of global segments 1212 includes a begin point at the location of point 1211 and an end point at the location of point 1213. The overall semantics of the present routing representation cause an identification of unchanged portion of the detail segment 1215 as the beginning element in the route for the present net. The representation of detail segment 1215 includes a begin point at the terminal 1204 and an end point at the beginning point 1211 of the global segments 1212. The other unchanged portion of the detail segment 1217 exists with a begin point 1213 at the end point of global segments 1212 and an end point at the terminal 1206. The overall semantics of the present routing representation cause an identification of detail segment 1217 as the end element in the route for the present net.

Referring to FIG. 14, a further detail routing action can be performed to convert global segments 1212 to detail segments 1214. The representation of detail segments 1214 includes a begin point at the location of point 1211 and an end point at the location of point 1213. As before, the overall semantics of the present routing representation cause an identification of unchanged portion of the detail segment 1215 as the beginning element in the route for the present net. The representation of detail segment 1215 includes a begin point at the terminal 1204 and an end point at the beginning point 1211 of the detail segments 1214. The other unchanged portion of the detail segment 1217 exists with a begin point 1213 at the end point of detail segments 1214 and an end point at the terminal 1206. The overall semantics of the present routing representation cause an identification of detail segment 1217 as the end element in the route for the present net.

Figure 15:
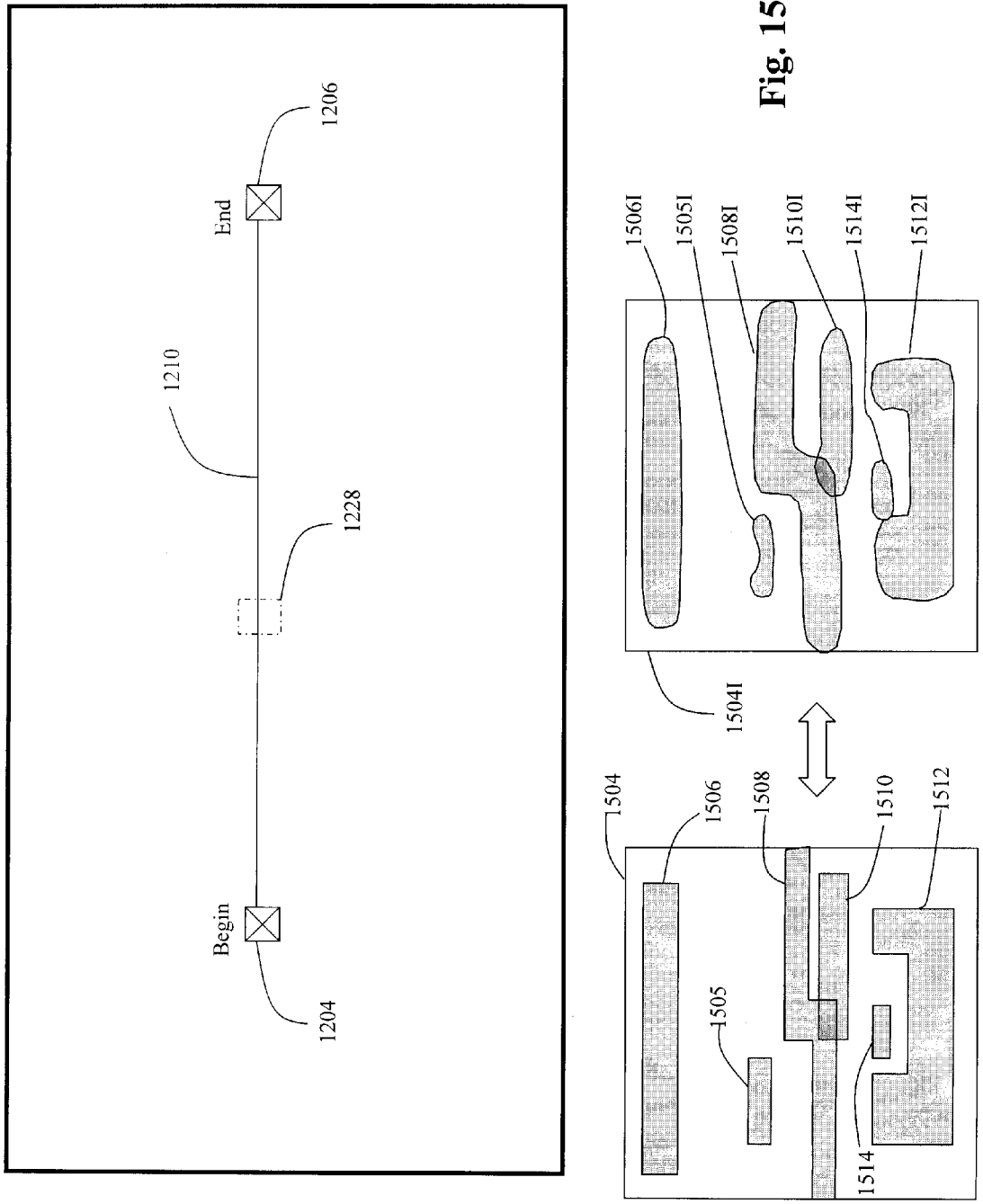

One novel feature of some embodiments of the invention is that reconfiguration and routing can be performed relative to imaged geometry. To illustrate this aspect, consider again the detail segment 1210 shown in FIG. 15 that extends from a Start terminal 1204 and ends at an End terminal 1206. Assume that a routing problem has been identified for the portion of the route contained within box 1504. That portion of the route is associated with an imaged geometry 1504I.

Box 1504 includes shapes 1505, 1506, 1508, 1510, 1512, and 1514. Consider if the imaged geometry representation 1504I shows that defects will occur based upon the configuration of box 1504. In particular, shape 1505 will result in imaged geometry shape 1505I, which is defective because of an excessive dip in the middle of the shape 1505I due to lithographic effects. Shapes 1508 and 1510 short against one another, which can be seen in box 1504 without imaged geometry but is also confirmed by the imaged geometries 1508I and 1510I. Shapes 1512 and 1514 appear separate in box 1504, but because of lithographic effects, it can be seen that these shapes will short together in the imaged geometry representations 1512I and 1514I.

Figure 16:
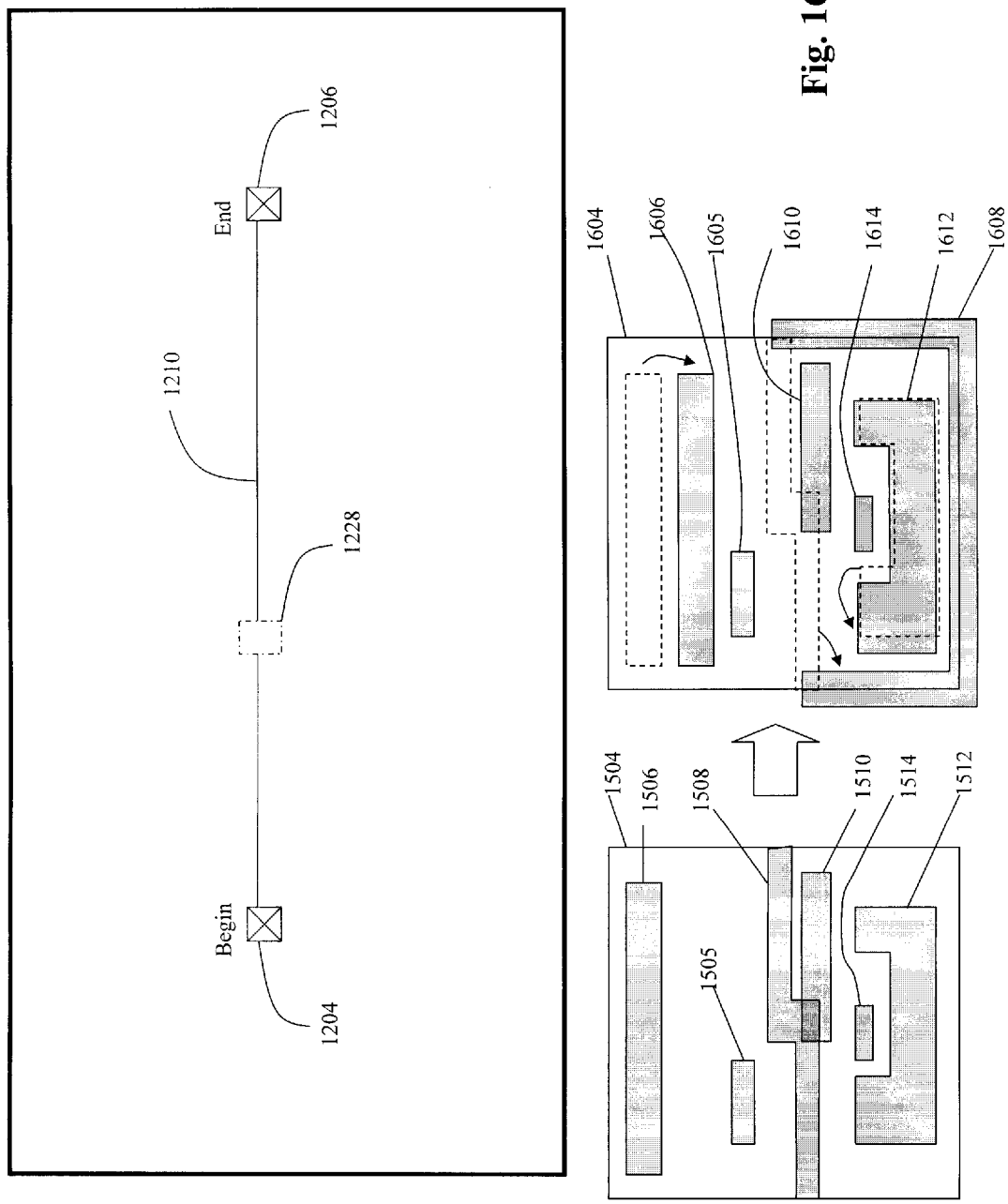

Partial reconfiguration may be performed against the problematic portion 1504 of detail segment 1210. As shown in FIG. 16, shape 1506 may be moved into a different position that is closer to shape 1505, resulting in the resulting reconfigured positions for these shapes shown by 1605 and 1606. Shape 1508 can be moved to avoid touching shape 1510, resulting in reconfigured shapes 1608 and 1610. The left-hand portion of shape 1512 can be moved away from shape 1514, resulting the reconfigures shape and positioning shown by shapes 1612 and 1614.

Figure 17:
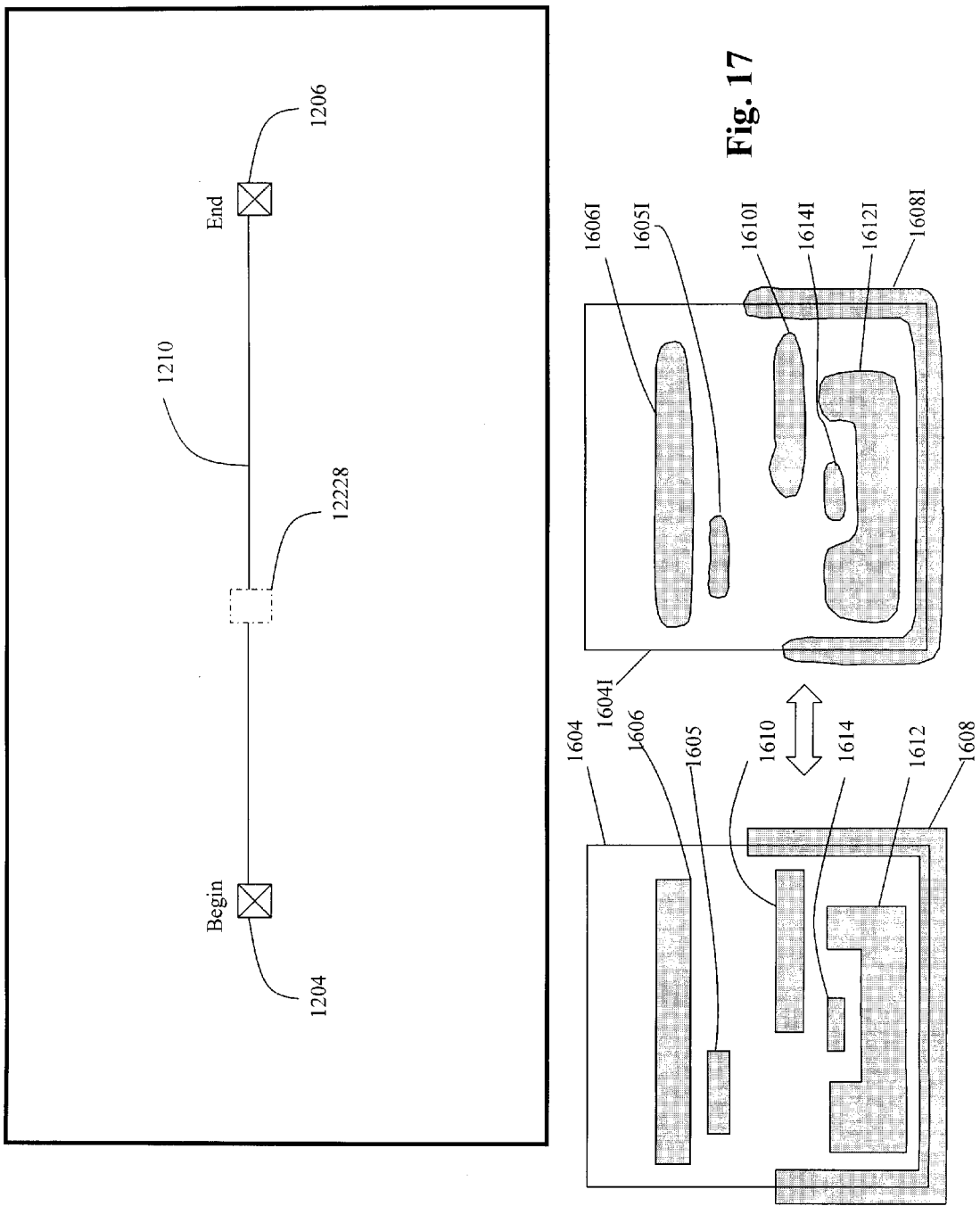

Referring to FIG. 17, the imaged geometries of the partially reconfigured shapes shown in box 1604 can be used to confirm that the previously identified routing problems have been corrected. In particular, the lithographic effect of moving shape 1606 closer to shape 1605 causes the imaged geometry representation to confirm that imaged geometry 1605I has a much flatter surface without the dip in the middle. Imaged geometry 1608I and 1610I confirms that these shapes 1608 and 1610 no longer short together. In addition, imaged geometries 1612I and 1614I confirm that the lithographic effects that formerly causes shapes 1512 and 1514 to short together have been corrected, and that shapes 1612 and 1614 will not short together after printing.

Some embodiments of the present invention utilize a level of abstraction for the routing representation to include electrical characteristics. This allows routing to be performed that is cognizant of electrical effects of a wiring segment on neighboring shapes and routes.

Figure 18:
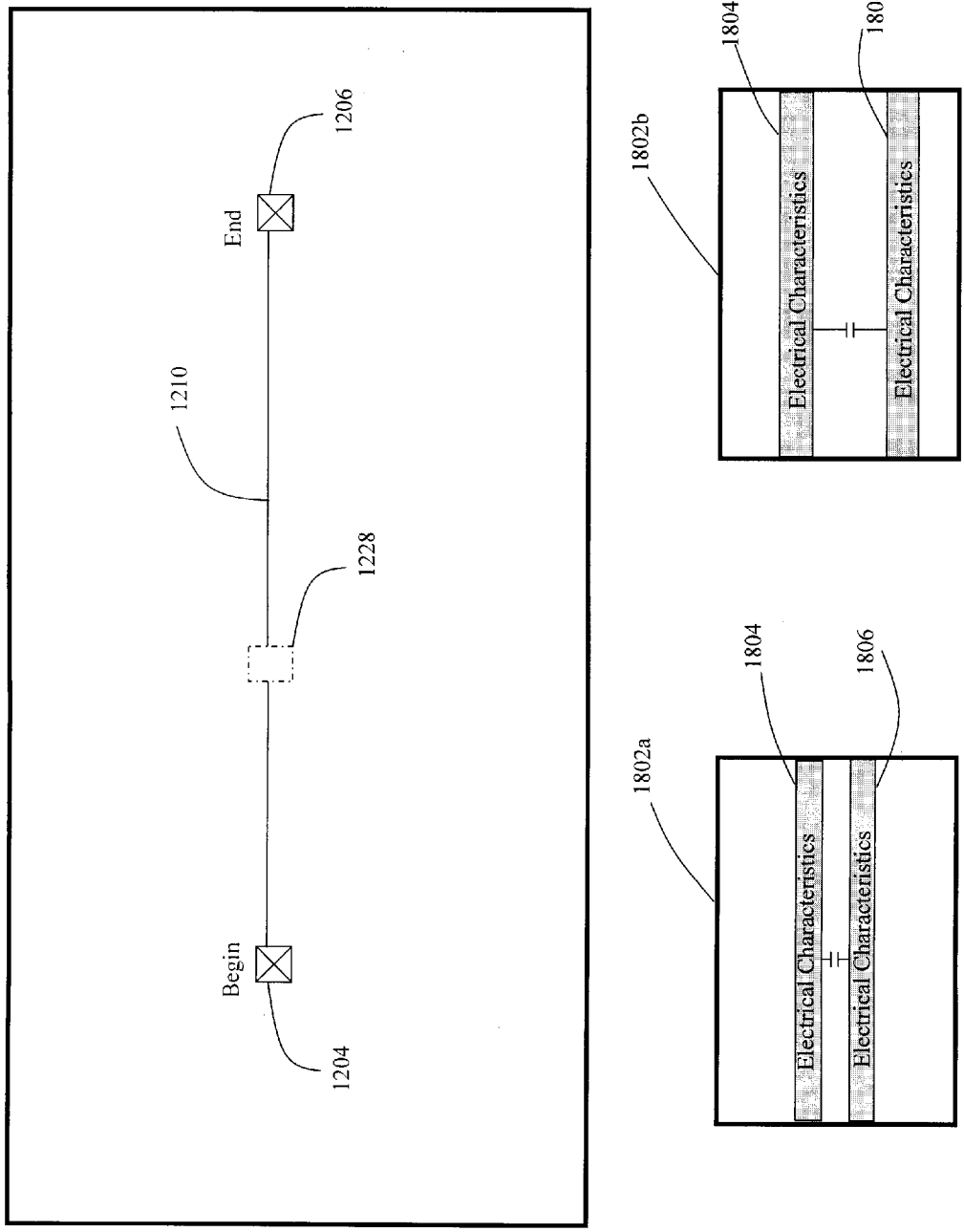
FIG. 18 illustrates using electrical characteristics representations to perform routing according to an embodiment of the invention.

To illustrate, consider the route shown in FIG. 18, which shows a detailed segment between a Start terminal 1204 and an End terminal 1206. Assume that the electrical characteristics representation for the portion of the detailed route 1210 shown in box 1228 exists and can be used to route or re-route the boxed portion 1228. For example, as shown in box 1802a, the electrical characteristics of two segments 1804 and 1806 can be represented. Based upon these electrical characteristics, it can be calculated that the distance between segments 1804 and 1806 are close enough together such that it will produce unacceptable levels of crosstalk. Therefore, partial reconfiguration can be performed as shown in box 1802b, by shifting the two wire segments 1804 and 1806 apart, such that the configuration produces acceptable levels of crosstalk.

It is noted that crosstalk-enabled routing can be performed that avoids the situation of 1802a from the very beginning. With crosstalk-aware routing, the electrical characteristics representation of segments 1804 and 1806 is considered during routing, such that the two wiring segments are routed with a configuration to avoid unacceptable levels of crosstalk. This means that configuration of 1802b is generated during the routing process. This is a distinct advantage over typical routing approaches that require multiple loops in which an initial routing design that is not aware of electrical characteristics produces a routing plan that has crosstalk problems, followed by a verification stage that checks and identifies the crosstalk problem, to another stage that then changes the route to correct the crosstalk problem (which may then undergo additional loops to correct yet additional problems causes by the solution to the initial crosstalk problem). In the present approach, the electrical characteristics representation can be integrally used to avoid such problems in the first place.

Figure 21:
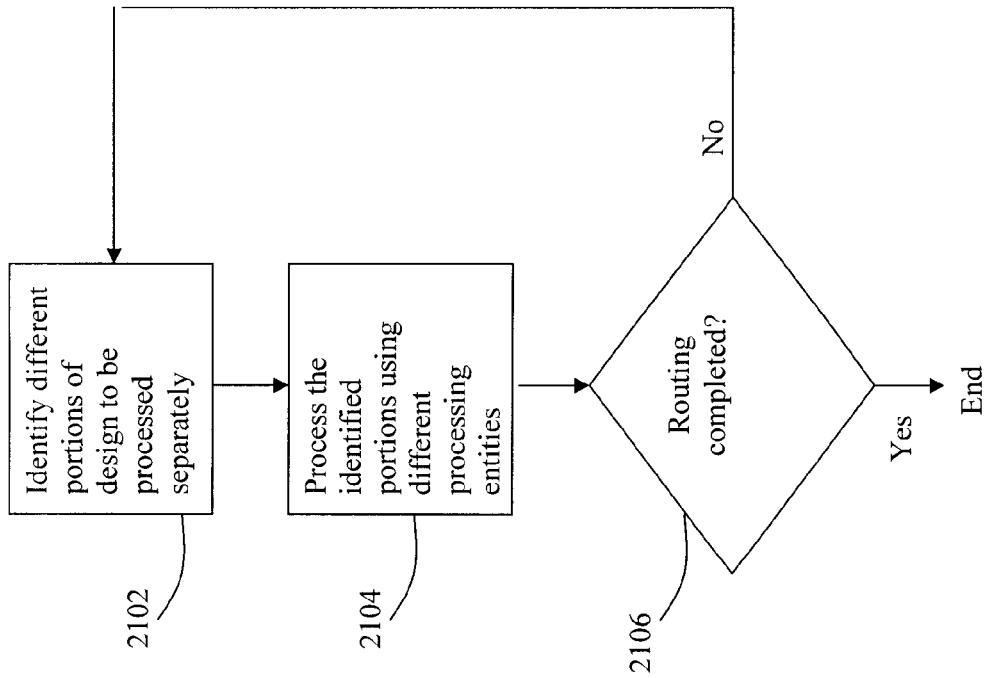
FIG. 21 shows a flowchart of a process for executing routing workload in parallel according to an embodiment of the invention.

The present approach provides the ability to process routing of different portions of the design in parallel. FIG. 21 shows a flowchart for implementing parallel processing of a design according to some embodiments of the invention.

At 2102, an identification is made of the different portions of the design to process separately. Different portions of the design may be handled independently of each other and at different abstraction levels. The different portions can then be matched together based upon using common standards for representation of the routing elements, e.g., by defining commonality of format with respect to start points values and end point values. The routing system and method can take the different portions of the design and associated routing work to generate a set of routing workloads.

At 2104, the different routing workloads are assigned to two or more different processing entities. The routing workloads, each of which are directed to a different portion of the design, may be assigned to different processing entities in the system. The different processing entities may then process the work in parallel to more efficiently or expeditiously route the design. Any suitable processing entity may be employed. A non-limiting list of examples of such processing entities include processes, threads, tasks, processors, nodes and CPUs.

Any suitable parallel processing approach may be used according to some embodiments of the invention. For example, multi-threading may be employed provide threads as the different processing entities to handle the workload. Distributed processing may also be employed to handle the parallel processing workloads. A combination of multi-threading and distributed processing may be employed in the invention.

At 2106, a determination is made whether the required routing tasks have been completed. If not, then the process returns back to 2102 and 2104 to identify routing workloads and have the workload performed by the processing entities in parallel.

System Architecture Overview

Figure 22:
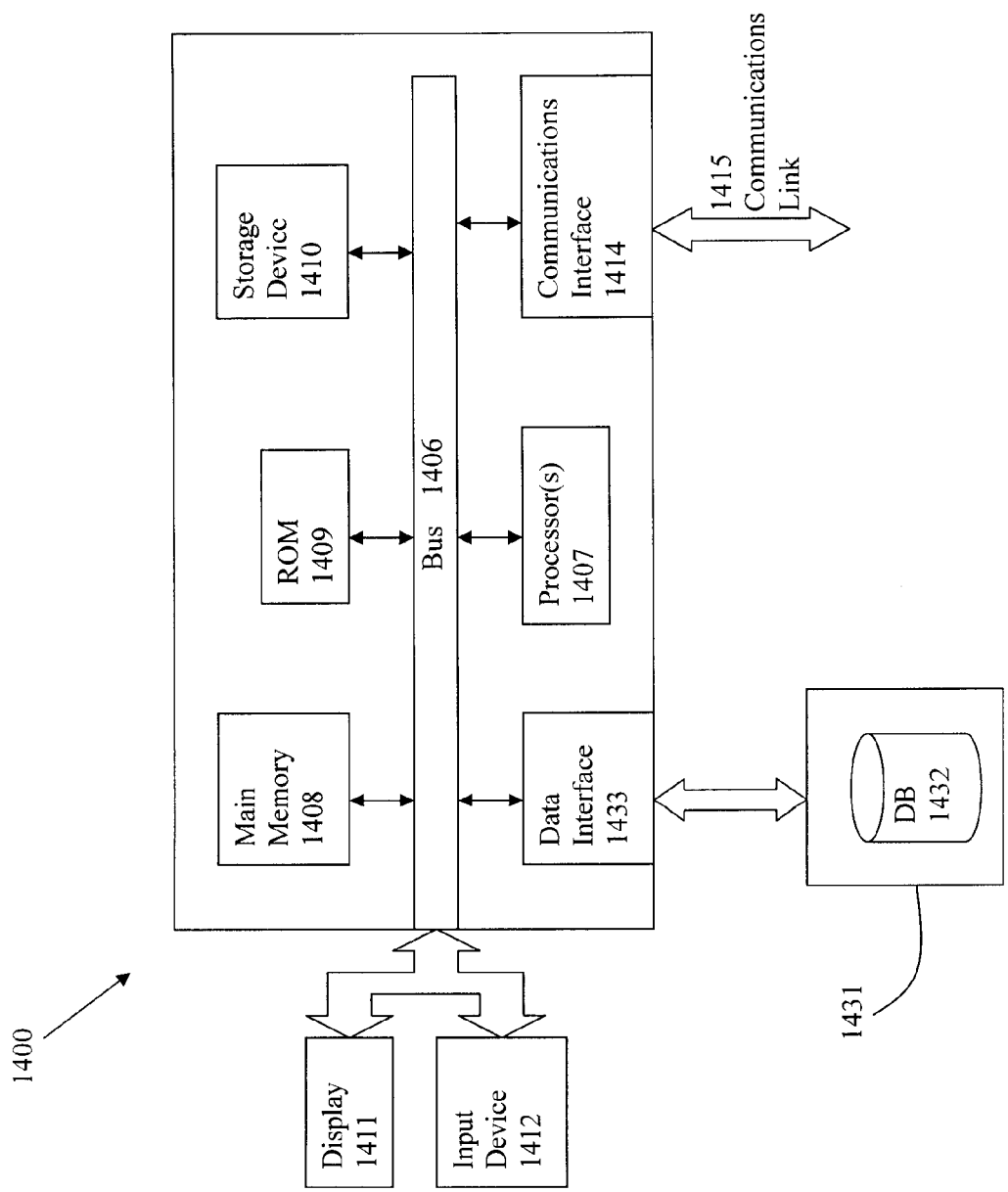
FIG. 22 illustrates an example computing architecture with which the invention may be implemented.

FIG. 22 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for routing an integrated circuit design, comprising:
   using a computer system which comprises at least one processor and is programmed for performing:
   identifying a route in an integrated circuit design to be reconfigured, wherein
   the route interconnects a begin point and an end point in the integrated circuit design;

17 selecting a first portion of the route for reconfiguration, the first portion of the route being less than the route in its entirety, wherein
the route further comprises a second portion; and
changing a routing configuration for the first portion of the route to create a reconfigured route for the first portion without affecting the second portion, the begin point, and the end point of the route, wherein;
the act of changing the routing configuration is performed at multiple routing abstraction levels for the route or a net.

2. The computer implemented method of claim 1, in which only a portion of a route is reconfigured.

3. The computer implemented method of claim 1, in which routing is performed using at least three routing abstraction levels.

4. The computer implemented method of claim 1, in which one of the abstraction levels from the at least three routing abstraction levels comprises either a guide representation, global segment representation, global via representation, detail segment representation, detail via representation, imaged geometry representation, or electrical characteristics representation.

5. The computer implemented method of claim 1, in which reconfiguration is performed relative to an imaged geometry, an electrical representation, or one or more guides.

6. The computer implemented method of claim 1, the process further comprising implementing a non-uniform progression of routing.

7. The computer implemented method of claim 1, the process further implemented by concentrating upon one or more specific portions of the integrated circuit design.

8. The computer implemented method of claim, 1 in which reconfiguration is performed against any element or portion of a route.

9. The computer implemented method of claim 1, comprising:
identifying a second portion of the integrated circuit design that is to undergo reconfiguration;
determining one or more levels of abstraction for the reconfiguration; and
reconfiguring the second portion at the selected one or more levels of abstraction.

10. A computer program product that includes a non-transitory computer readable storage medium, the computer readable storage medium comprising a plurality of computer instructions which, when executed by at least one processor, cause the at least one processor to execute a process for routing an integrated circuit design, the process comprising:
using a computer system which comprises the at least one processor and is programmed for performing:
identifying a route in an integrated circuit design to be reconfigured, wherein
the route interconnects a begin point and an end point in the integrated circuit design;
selecting a first portion of the route for reconfiguration, the portion of the route being less than the route in its entirety, wherein
the route further comprises a second portion;
changing a routing configuration for the first portion of the route to create a reconfigured route for the first portion without affecting the second portion, the begin point, and the end point of the route,
the act of changing the routing configuration is performed at multiple routing abstraction levels for the route or a net.

11. The computer program product of claim 10, in which only a portion of the route is reconfigured.

18

12. The computer program product of claim 10, in which reconfiguration is performed at the multiple routing abstraction levels for a same net.

13. The computer program product of claim 12, in which routing is performed using at least three routing abstraction levels.

14. The computer program product of claim 12, in which one of the abstraction levels from the at least three routing abstraction levels comprises either a guide representation, global segment representation, global via representation, detail segment representation, detail via representation, imaged geometry representation, or electrical characteristics representation.

15. The computer program product of claim 10, in which reconfiguration is performed relative to an imaged geometry, an electrical representation, or one or more guides.

16. The computer program product of claim 10, in which the process further comprises implementing a non-uniform progression of routing.

17. The computer program product of claim 10, in which the process is further implemented by concentrating upon one or more specific portions of the integrated circuit design.

18. The computer program product of claim 10 in which reconfiguration is performed against any element or portion of the route.

19. The computer program product of claim 10, the process further comprising:
identifying a portion of a design that is to undergo reconfiguration;
determining one or more levels of abstraction for the reconfiguration; and
reconfiguring the portion at the one or more levels of abstraction.

20. A system for routing an integrated circuit design, comprising:
at least one processor that is programmed for performing a process, the process comprising:
identifying a route in an integrated circuit design to be reconfigured, wherein
the route interconnects a begin point and an end point in the integrated circuit design;
selecting a first portion of the route for reconfiguration, the first portion of the route being less than the route in its entirety, wherein
the route further comprises a second portion; and
changing a routing configuration for the first portion of the route to create a reconfigured route for the first portion without affection the second portion, the begin point, and the end point of the route, wherein
the act of changing the routing configuration is performed at multiple routing abstraction levels for the route or a net.

21. The system of claim 20, in which only a portion of a route is reconfigured.

22. The system of claim 20, in which the act of changing the routing configuration is performed at the multiple routing abstraction levels for a same net.

23. The system of claim 22, in which routing is performed using at least three routing abstraction levels.

24. The system of claim 22, in which one of the at least three routing abstraction levels comprises either a guide representation, global segment representation, global via representation, detail segment representation, detail via representation, imaged geometry representation, or electrical characteristics representation.

25. The system of claim 20, in which reconfiguration by changing the routing configuration is performed relative to an imaged geometry or an electrical representation or one or more guides.

26. The system of claim 20, in which the at least one processor is programmed for performing the process, the process further comprising implementing a non-uniform progression of routing.

27. The system of claim 20, in which the at least one processor is programmed for performing the process, the process being further implemented by concentrating upon one or more specific portions of the integrated circuit design.

28. The system of claim 20, in which reconfiguration by changing the routing configuration is performed against any element or portion of the route.

29. The system of claim 20, in which the at least one processor is programmed for performing the process, the process further comprising:
   identifying a portion of a design that is to undergo reconfiguration;
   determining one or more levels of abstraction for the reconfiguration; and
   reconfiguring the portion at the one or more levels of abstraction.

* * * * *